US010734965B1

(12) United States Patent
McPherson et al.

(10) Patent No.: US 10,734,965 B1
(45) Date of Patent: Aug. 4, 2020

(54) AUDIO CALIBRATION OF A PORTABLE PLAYBACK DEVICE

(71) Applicant: Sonos, Inc., Santa Barbara, CA (US)

(72) Inventors: Patrick McPherson, Somerville, MA (US); Aurelio Rafael Ramos, Jamaica Plain, MA (US)

(73) Assignee: SONOS, INC., Santa Barbara, CA (US)

( * ) Notice: Subject to any disclaimer, the term of this patent is extended or adjusted under 35 U.S.C. 154(b) by 0 days.

(21) Appl. No.: 16/538,629

(22) Filed: Aug. 12, 2019

(51) Int. Cl.
*H03G 5/16* (2006.01)
*G06F 3/16* (2006.01)
*H04R 29/00* (2006.01)

(52) U.S. Cl.
CPC ............. *H03G 5/165* (2013.01); *G06F 3/165* (2013.01); *H04R 29/001* (2013.01)

(58) Field of Classification Search
CPC .......... H03G 5/165; H03G 5/16; G06F 3/165; H04R 29/001; H04S 7/307
See application file for complete search history.

(56) References Cited

U.S. PATENT DOCUMENTS

| 4,306,113 A | 12/1981 | Morton |
| 4,342,104 A | 7/1982 | Jack |
| 4,504,704 A | 3/1985 | Ohyaba et al. |
| 4,592,088 A | 5/1986 | Shimada |
| 4,628,530 A | 12/1986 | Op et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |

(Continued)

FOREIGN PATENT DOCUMENTS

| CN | 1447624 A | 10/2003 |
| CN | 1984507 A | 6/2007 |

(Continued)

OTHER PUBLICATIONS

Notice of Allowance dated Sep. 19, 2017, issued in connection with U.S. Appl. No. 14/793,205, filed Jul. 7, 2015, 16 pages.

(Continued)

*Primary Examiner* — Mark Fischer
(74) *Attorney, Agent, or Firm* — McDonnell Boehnen Hulbert & Berghoff LLP

(57) ABSTRACT

Disclosed herein are example techniques to facilitate calibrating a portable playback device. An example implementation involves determining that a playback device is to perform an equalization calibration of the playback device and initiating the equalization calibration. Initiating the equalization calibration involves (i) outputting audio content, (ii) capturing audio data representing reflections of the audio content within an area in which the playback device is located, (iii) determining an acoustic response of the area in which the playback device is located, (iv) selecting a stored acoustic response from the acoustic response database that is most similar to the determined acoustic response of the area in which the playback device is located, and (v) applying to the audio content, via the playback device, a set of stored audio calibration settings associated with the selected stored acoustic area response.

20 Claims, 13 Drawing Sheets

(56) References Cited

U.S. PATENT DOCUMENTS

| | | |
|---|---|---|
| 5,440,644 A | 8/1995 | Farinelli et al. |
| 5,553,147 A | 9/1996 | Pineau |
| 5,581,621 A | 12/1996 | Koyama et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | Dilorenzo |
| 6,363,155 B1 | 3/2002 | Horbach |
| 6,404,811 B1 | 6/2002 | Cvetko et al. |
| 6,469,633 B1 | 10/2002 | Wachter et al. |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,757,517 B2 | 6/2004 | Chang et al. |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsuk et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee |
| 7,676,044 B2 | 3/2010 | Sasaki et al. |
| 7,689,305 B2 | 3/2010 | Kreifeldt et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowall et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | MacDonald et al. |
| 8,234,395 B2 | 7/2012 | Millington |
| 8,238,547 B2 | 8/2012 | Ohki et al. |
| 8,238,578 B2 | 8/2012 | Aylward |
| 8,243,961 B1 | 8/2012 | Morrill |
| 8,264,408 B2 | 9/2012 | Kainulainen et al. |
| 8,265,310 B2 | 9/2012 | Berardi et al. |
| 8,270,620 B2 | 9/2012 | Christensen et al. |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,682,002 B2 | 3/2014 | Wihardja et al. |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann et al. |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,996,370 B2 | 3/2015 | Ansell |

(56) References Cited

U.S. PATENT DOCUMENTS

| | | |
|---|---|---|
| 9,020,153 B2 | 4/2015 | Britt, Jr. |
| 9,021,153 B2 | 4/2015 | Lu |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,319,816 B1 | 4/2016 | Narayanan |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,560,449 B2 | 1/2017 | Carlsson et al. |
| 9,560,460 B2 | 1/2017 | Chaikin et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,674,625 B2 | 6/2017 | Armstrong-Muntner et al. |
| 9,678,708 B2 | 6/2017 | Bierbower et al. |
| 9,689,960 B1 | 6/2017 | Barton et al. |
| 9,690,271 B2 | 6/2017 | Sheen et al. |
| 9,690,539 B2 | 6/2017 | Sheen et al. |
| 9,706,323 B2 | 7/2017 | Sheen et al. |
| 9,715,365 B2 | 7/2017 | Kusano et al. |
| 9,723,420 B2 | 8/2017 | Family et al. |
| 9,736,584 B2 | 8/2017 | Sheen et al. |
| 9,743,207 B1 | 8/2017 | Hartung |
| 9,743,208 B2 | 8/2017 | Oishi et al. |
| 9,749,763 B2 | 8/2017 | Sheen |
| 9,763,018 B1 | 9/2017 | McPherson et al. |
| 9,781,532 B2 | 10/2017 | Sheen |
| 9,788,113 B2 | 10/2017 | Wilberding et al. |
| 9,860,662 B2 | 1/2018 | Jarvis et al. |
| 9,864,574 B2 | 1/2018 | Hartung et al. |
| 9,910,634 B2 | 3/2018 | Sheen et al. |
| 9,913,056 B2 | 3/2018 | Master et al. |
| 9,916,126 B2 | 3/2018 | Lang |
| 9,952,825 B2 | 4/2018 | Sheen |
| 10,045,142 B2 | 8/2018 | McPherson et al. |
| 10,154,359 B2 | 12/2018 | Sheen |
| 10,206,052 B2 | 2/2019 | Perianu |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani et al. |
| 2002/0136414 A1 | 9/2002 | Jordan et al. |
| 2002/0146136 A1 | 10/2002 | Carter et al. |
| 2003/0002689 A1 | 1/2003 | Folio |
| 2003/0031334 A1 | 2/2003 | Layton et al. |
| 2003/0157951 A1 | 8/2003 | Hasty |
| 2003/0161479 A1 | 8/2003 | Yang et al. |
| 2003/0161492 A1 | 8/2003 | Miller et al. |
| 2003/0179891 A1 | 9/2003 | Rabinowitz et al. |
| 2003/0235311 A1 | 12/2003 | Grancea et al. |
| 2004/0024478 A1 | 2/2004 | Hans et al. |
| 2004/0131338 A1 | 7/2004 | Asada et al. |
| 2004/0237750 A1 | 12/2004 | Smith et al. |
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington |
| 2007/0086597 A1 | 4/2007 | Kino |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2008/0002839 A1 | 1/2008 | Eng |
| 2008/0014989 A1 | 1/2008 | Sandegard et al. |
| 2008/0065247 A1 | 3/2008 | Igoe |
| 2008/0069378 A1 | 3/2008 | Rabinowitz et al. |
| 2008/0077261 A1 | 3/2008 | Baudino et al. |
| 2008/0098027 A1 | 4/2008 | Aarts |
| 2008/0136623 A1 | 6/2008 | Calvarese |
| 2008/0144864 A1 | 6/2008 | Huon et al. |
| 2008/0175411 A1 | 7/2008 | Greve |
| 2008/0214160 A1 | 9/2008 | Jonsson |
| 2008/0232603 A1 | 9/2008 | Soulodre et al. |
| 2008/0266385 A1 | 10/2008 | Smith et al. |
| 2008/0281523 A1 | 11/2008 | Dahl et al. |
| 2009/0003613 A1 | 1/2009 | Christensen et al. |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0110218 A1 | 4/2009 | Swain |
| 2009/0138507 A1 | 5/2009 | Burckart et al. |
| 2009/0147134 A1 | 6/2009 | Iwamatsu |
| 2009/0175476 A1 | 7/2009 | Bottum |
| 2009/0180632 A1 | 7/2009 | Goldberg et al. |
| 2009/0196428 A1 | 8/2009 | Kim |
| 2009/0202082 A1 | 8/2009 | Bharitkar et al. |
| 2009/0252481 A1 | 10/2009 | Ekstrand |
| 2009/0304194 A1 | 12/2009 | Eggleston et al. |
| 2009/0304205 A1 | 12/2009 | Hardacker et al. |
| 2009/0316923 A1 | 12/2009 | Tashev et al. |
| 2010/0013550 A1 | 1/2010 | Tanaka |
| 2010/0095332 A1 | 4/2010 | Gran et al. |
| 2010/0128902 A1 | 5/2010 | Liu et al. |
| 2010/0135501 A1 | 6/2010 | Corbett et al. |
| 2010/0142735 A1 | 6/2010 | Yoon et al. |
| 2010/0146445 A1 | 6/2010 | Kraut |
| 2010/0162117 A1 | 6/2010 | Basso et al. |
| 2010/0189203 A1 | 7/2010 | Wilhelmsson et al. |
| 2010/0195846 A1 | 8/2010 | Yokoyama |
| 2010/0272270 A1 | 10/2010 | Chaikin et al. |
| 2010/0296659 A1 | 11/2010 | Tanaka |
| 2010/0303248 A1 | 12/2010 | Tawada |
| 2010/0303250 A1 | 12/2010 | Goldberg et al. |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0087842 A1 | 4/2011 | Lu et al. |
| 2011/0091055 A1 | 4/2011 | Leblanc |
| 2011/0135103 A1 | 6/2011 | Sun et al. |
| 2011/0150228 A1 | 6/2011 | Yoon et al. |
| 2011/0150230 A1 | 6/2011 | Tanaka |
| 2011/0170710 A1 | 7/2011 | Son |
| 2011/0234480 A1 | 9/2011 | Fino et al. |
| 2011/0235808 A1 | 9/2011 | Kon |
| 2011/0268281 A1 | 11/2011 | Florencio et al. |
| 2012/0032928 A1 | 2/2012 | Alberth et al. |
| 2012/0051558 A1 | 3/2012 | Kim et al. |
| 2012/0057724 A1 | 3/2012 | Rabinowitz et al. |
| 2012/0063615 A1 | 3/2012 | Crockett et al. |
| 2012/0093320 A1 | 4/2012 | Flaks et al. |
| 2012/0127831 A1 | 5/2012 | Gicklhorn et al. |
| 2012/0140936 A1 | 6/2012 | Bonnick et al. |
| 2012/0148075 A1 | 6/2012 | Goh et al. |
| 2012/0183156 A1 | 7/2012 | Schlessinger et al. |
| 2012/0213391 A1 | 8/2012 | Usami et al. |
| 2012/0215530 A1 | 8/2012 | Harsch et al. |

(56) References Cited

U.S. PATENT DOCUMENTS

| | | |
|---|---|---|
| 2012/0237037 A1 | 9/2012 | Ninan et al. |
| 2012/0243697 A1 | 9/2012 | Frye et al. |
| 2012/0263325 A1 | 10/2012 | Freeman et al. |
| 2012/0268145 A1 | 10/2012 | Chandra et al. |
| 2012/0269356 A1 | 10/2012 | Sheerin et al. |
| 2012/0275613 A1 | 11/2012 | Soulodre et al. |
| 2012/0283593 A1 | 11/2012 | Searchfield et al. |
| 2012/0288124 A1 | 11/2012 | Fejzo et al. |
| 2013/0010970 A1 | 1/2013 | Hegarty et al. |
| 2013/0028443 A1 | 1/2013 | Pance et al. |
| 2013/0051572 A1 | 2/2013 | Goh et al. |
| 2013/0066453 A1 | 3/2013 | Seefeldt |
| 2013/0108055 A1 | 5/2013 | Hanna et al. |
| 2013/0129102 A1 | 5/2013 | Li et al. |
| 2013/0129122 A1 | 5/2013 | Johnson et al. |
| 2013/0166227 A1 | 6/2013 | Hermann et al. |
| 2013/0170647 A1 | 7/2013 | Reilly et al. |
| 2013/0202131 A1 | 8/2013 | Kemmochi et al. |
| 2013/0211843 A1 | 8/2013 | Clarkson |
| 2013/0216071 A1 | 8/2013 | Maher et al. |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti et al. |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2013/0331970 A1 | 12/2013 | Beckhardt et al. |
| 2014/0003611 A1 | 1/2014 | Mohammad et al. |
| 2014/0003622 A1 | 1/2014 | Ikizyan et al. |
| 2014/0003623 A1 | 1/2014 | Lang |
| 2014/0003625 A1 | 1/2014 | Sheen et al. |
| 2014/0003626 A1 | 1/2014 | Holman et al. |
| 2014/0003635 A1 | 1/2014 | Mohammad et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0029201 A1 | 1/2014 | Yang et al. |
| 2014/0032709 A1 | 1/2014 | Saussy et al. |
| 2014/0037097 A1 | 2/2014 | Labosco |
| 2014/0037107 A1 | 2/2014 | Marino, Jr. et al. |
| 2014/0052770 A1 | 2/2014 | Gran et al. |
| 2014/0064501 A1 | 3/2014 | Olsen et al. |
| 2014/0079242 A1 | 3/2014 | Nguyen et al. |
| 2014/0084014 A1 | 3/2014 | Sim et al. |
| 2014/0086423 A1 | 3/2014 | Domingo et al. |
| 2014/0112481 A1 | 4/2014 | Li et al. |
| 2014/0119551 A1 | 5/2014 | Bharitkar et al. |
| 2014/0126730 A1 | 5/2014 | Crawley et al. |
| 2014/0161265 A1 | 6/2014 | Chaikin et al. |
| 2014/0169569 A1 | 6/2014 | Toivanen et al. |
| 2014/0180684 A1 | 6/2014 | Strub |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0279889 A1 | 9/2014 | Luna et al. |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0294201 A1 | 10/2014 | Johnson et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0334644 A1 | 11/2014 | Selig et al. |
| 2014/0341399 A1 | 11/2014 | Dusse |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2015/0011195 A1 | 1/2015 | Li |
| 2015/0016642 A1 | 1/2015 | Walsh et al. |
| 2015/0023509 A1 | 1/2015 | Devantier et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis et al. |
| 2015/0100991 A1 | 4/2015 | Risberg et al. |
| 2015/0146886 A1 | 5/2015 | Baumgarte |
| 2015/0149943 A1 | 5/2015 | Nguyen et al. |
| 2015/0161360 A1 | 6/2015 | Paruchuri et al. |
| 2015/0195666 A1 | 7/2015 | Massey et al. |
| 2015/0201274 A1 | 7/2015 | Ellner et al. |
| 2015/0208184 A1 | 7/2015 | Tan et al. |
| 2015/0220558 A1 | 8/2015 | Snibbe et al. |
| 2015/0223002 A1 | 8/2015 | Mehta et al. |
| 2015/0229699 A1 | 8/2015 | Liu |
| 2015/0260754 A1 | 9/2015 | Perotti et al. |
| 2015/0271616 A1 | 9/2015 | Kechichian et al. |
| 2015/0281866 A1 | 10/2015 | Williams et al. |
| 2015/0289064 A1 | 10/2015 | Jensen et al. |
| 2015/0358756 A1 | 12/2015 | Harma et al. |
| 2015/0382128 A1 | 12/2015 | Ridihalgh et al. |
| 2016/0007116 A1 | 1/2016 | Holman |
| 2016/0011850 A1 | 1/2016 | Sheen et al. |
| 2016/0014509 A1 | 1/2016 | Hansson et al. |
| 2016/0014536 A1 | 1/2016 | Sheen |
| 2016/0021458 A1 | 1/2016 | Johnson et al. |
| 2016/0021473 A1 | 1/2016 | Riggi et al. |
| 2016/0021481 A1 | 1/2016 | Johnson et al. |
| 2016/0027467 A1 | 1/2016 | Proud |
| 2016/0029142 A1 | 1/2016 | Isaac et al. |
| 2016/0035337 A1 | 2/2016 | Aggarwal et al. |
| 2016/0036881 A1 | 2/2016 | Tembey et al. |
| 2016/0037277 A1 | 2/2016 | Matsumoto et al. |
| 2016/0061597 A1 | 3/2016 | De et al. |
| 2016/0073210 A1 | 3/2016 | Sheen |
| 2016/0088438 A1 | 3/2016 | O'Keeffe |
| 2016/0119730 A1 | 4/2016 | Virtanen |
| 2016/0140969 A1 | 5/2016 | Srinivasan et al. |
| 2016/0165297 A1 | 6/2016 | Jamal-Syed et al. |
| 2016/0192098 A1 | 6/2016 | Oishi et al. |
| 2016/0192099 A1 | 6/2016 | Oishi et al. |
| 2016/0212535 A1 | 7/2016 | Le et al. |
| 2016/0239255 A1 | 8/2016 | Chavez et al. |
| 2016/0254696 A1 | 9/2016 | Plumb et al. |
| 2016/0260140 A1 | 9/2016 | Shirley et al. |
| 2016/0309276 A1 | 10/2016 | Ridihalgh et al. |
| 2016/0330562 A1 | 11/2016 | Crockett |
| 2016/0366517 A1 | 12/2016 | Chandran et al. |
| 2017/0069338 A1 | 3/2017 | Elliot et al. |
| 2017/0083279 A1 | 3/2017 | Sheen |
| 2017/0086003 A1 | 3/2017 | Rabinowitz et al. |
| 2017/0105084 A1 | 4/2017 | Holman |
| 2017/0142532 A1 | 5/2017 | Pan |
| 2017/0207762 A1 | 7/2017 | Porter et al. |
| 2017/0223447 A1 | 8/2017 | Johnson et al. |
| 2017/0230772 A1 | 8/2017 | Johnson et al. |
| 2017/0257722 A1 | 9/2017 | Kerdranvat et al. |
| 2017/0280265 A1 | 9/2017 | Po |
| 2017/0303039 A1 | 10/2017 | Iyer et al. |
| 2017/0311108 A1 | 10/2017 | Patel |
| 2017/0374482 A1 | 12/2017 | McPherson et al. |
| 2018/0122378 A1 | 5/2018 | Mixter et al. |
| 2019/0037328 A1 | 1/2019 | McPherson et al. |

FOREIGN PATENT DOCUMENTS

| | | |
|---|---|---|
| CN | 101366177 A | 2/2009 |
| CN | 101491116 A | 7/2009 |
| CN | 101681219 A | 3/2010 |
| CN | 102318325 A | 1/2012 |
| CN | 102893633 A | 1/2013 |
| CN | 103491397 A | 1/2014 |
| CN | 103988523 A | 8/2014 |

(56) References Cited

FOREIGN PATENT DOCUMENTS

| | | | |
|---|---|---|---|
| CN | 104284291 | A | 1/2015 |
| CN | 105163221 | A | 12/2015 |
| EP | 0505949 | A1 | 9/1992 |
| EP | 0772374 | A2 | 5/1997 |
| EP | 1133896 | B1 | 8/2002 |
| EP | 1349427 | A2 | 10/2003 |
| EP | 1389853 | A1 | 2/2004 |
| EP | 2043381 | A2 | 4/2009 |
| EP | 1349427 | B1 | 12/2009 |
| EP | 2161950 | A2 | 3/2010 |
| EP | 2194471 | A1 | 6/2010 |
| EP | 2197220 | A2 | 6/2010 |
| EP | 2429155 | A1 | 3/2012 |
| EP | 1825713 | B1 | 10/2012 |
| EP | 2613573 | A1 | 7/2013 |
| EP | 2591617 | B1 | 6/2014 |
| EP | 2835989 | A2 | 2/2015 |
| EP | 2860992 | A1 | 4/2015 |
| EP | 2874413 | A1 | 5/2015 |
| EP | 3128767 | A2 | 2/2017 |
| EP | 2974382 | B1 | 4/2017 |
| JP | H02280199 | A | 11/1990 |
| JP | H05199593 | A | 8/1993 |
| JP | H05211700 | A | 8/1993 |
| JP | H06327089 | A | 11/1994 |
| JP | H0723490 | A | 1/1995 |
| JP | H1069280 | A | 3/1998 |
| JP | 2002502193 | A | 1/2002 |
| JP | 2003143252 | A | 5/2003 |
| JP | 2003304590 | A | 10/2003 |
| JP | 2005086686 | A | 3/2005 |
| JP | 2005538633 | A | 12/2005 |
| JP | 2006017893 | A | 1/2006 |
| JP | 2006180039 | A | 7/2006 |
| JP | 2007068125 | A | 3/2007 |
| JP | 2007271802 | A | 10/2007 |
| JP | 2008228133 | A | 9/2008 |
| JP | 2009188474 | A | 8/2009 |
| JP | 2010081124 | A | 4/2010 |
| JP | 2010141892 | A | 6/2010 |
| JP | 2011123376 | A | 6/2011 |
| JP | 2011130212 | A | 6/2011 |
| JP | 2011164166 | A | 8/2011 |
| JP | 2011217068 | A | 10/2011 |
| JP | 2013253884 | A | 12/2013 |
| KR | 1020060116383 | | 11/2006 |
| KR | 1020080011831 | | 2/2008 |
| WO | 200153994 | | 7/2001 |
| WO | 0182650 | A2 | 11/2001 |
| WO | 200182650 | | 11/2001 |
| WO | 2003093950 | A2 | 11/2003 |
| WO | 2004066673 | A1 | 8/2004 |
| WO | 2007016465 | A2 | 2/2007 |
| WO | 2011139502 | A1 | 11/2011 |
| WO | 2013016500 | A1 | 1/2013 |
| WO | 2014032709 | | 3/2014 |
| WO | 2014032709 | A1 | 3/2014 |
| WO | 2014036121 | A1 | 3/2014 |
| WO | 2015024881 | A1 | 2/2015 |
| WO | 2015108794 | A1 | 7/2015 |
| WO | 2015178950 | A1 | 11/2015 |
| WO | 2016040324 | A1 | 3/2016 |
| WO | 2017049169 | A1 | 3/2017 |

OTHER PUBLICATIONS

Notice of Allowance dated Sep. 19, 2018, issued in connection with U.S. Appl. No. 14/864,393, filed Sep. 24, 2015, 10 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Oct. 21, 2019, issued in connection with U.S. Appl. No. 16/182,886, filed Nov. 7, 2018, 10 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Jun. 23, 2016, issued in connection with U.S. Appl. No. 14/921,781, filed Oct. 23, 2015, 8 pages.
Notice of Allowance dated May 23, 2018, issued in connection with U.S. Appl. No. 15/698,283, filed Sep. 7, 2017, 8 pages.
Notice of Allowance dated Oct. 23, 2017, issued in connection with U.S. Appl. No. 14/481,522, filed Sep. 9, 2014, 16 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.
Notice of Allowance dated Jun. 27, 2017, issued in connection with U.S. Appl. No. 15/344,069, filed Nov. 4, 2016, 8 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Aug. 29, 2019, issued in connection with U.S. Appl. No. 16/185,906, filed Nov. 9, 2018, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.

(56) References Cited

OTHER PUBLICATIONS

Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Oct. 4, 2018, issued in connection with U.S. Appl. No. 15/166,241, filed May 26, 2016, 7 pages.
Non-Final Office Action dated Mar. 29, 2018, issued in connection with U.S. Appl. No. 15/716,313, filed Sep. 26, 2017, 16 pages.
Non-Final Office Action dated Aug. 30, 2019, issued in connection with U.S. Appl. No. 16/115,525, filed Aug. 28, 2018, 13 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
Notice of Allowance dated Nov. 9, 2016, issued in connection with U.S. Appl. No. 14/805,340, filed Jul. 21, 2015, 13 pages.
Notice of Allowance dated Feb. 1, 2018, issued in connection with U.S. Appl. No. 15/480,265, filed Apr. 5, 2017, 8 pages.
Notice of Allowance dated Apr. 10, 2015, issued in connection with U.S. Appl. No. 13/536,493, filed Jun. 28, 2012, 8 pages.
Notice of Allowance dated Aug. 10, 2018, issued in connection with U.S. Appl. No. 15/785,088, filed Oct. 16, 2017, 6 pages.
Notice of Allowance dated Jul. 10, 2018, issued in connection with U.S. Appl. No. 15/673,170, filed Aug. 9, 2017, 2 pages.
Notice of Allowance dated Dec. 11, 2018, issued in connection with U.S. Appl. No. 15/909,327, filed Mar. 1, 2018, 10 pages.
Notice of Allowance dated Feb. 11, 2019, issued in connection with U.S. Appl. No. 15/588,186, filed May 5, 2017, 5 pages.
Notice of Allowance dated Jul. 11, 2017, issued in connection with U.S. Appl. No. 14/678,248, filed Apr. 3, 2015, 11 pages.
Notice of Allowance dated Mar. 11, 2015, issued in connection with U.S. Appl. No. 13/340,126, filed Dec. 29, 2011, 7 pages.
Notice of Allowance dated Apr. 12, 2016, issued in connection with U.S. Appl. No. 14/681,465, filed Apr. 8, 2015, 13 pages.
Notice of Allowance dated Aug. 12, 2019, issued in connection with U.S. Appl. No. 16/416,648, filed May 20, 2019, 7 pages.
Notice of Allowance dated Dec. 12, 2016, issued in connection with U.S. Appl. No. 14/805,140, filed Jul. 21, 2015, 24 pages.
Notice of Allowance dated Dec. 12, 2017, issued in connection with U.S. Appl. No. 14/481,505, filed Sep. 9, 2014, 9 pages.
Notice of Allowance dated Nov. 12, 2019, issued in connection with U.S. Appl. No. 15/955,545, filed Apr. 17, 2018, 9 pages.
Notice of Allowance dated Sep. 12, 2016, issued in connection with U.S. Appl. No. 15/066,072, filed Mar. 10, 2016, 7 pages.
Notice of Allowance dated Sep. 12, 2017, issued in connection with U.S. Appl. No. 15/207,682, filed Jul. 12, 2016, 8 pages.
Notice of Allowance dated Feb. 13, 2017, issued in connection with U.S. Appl. No. 14/864,506, filed Sep. 24, 2015, 8 pages.
Notice of Allowance dated Nov. 13, 2017, issued in connection with U.S. Appl. No. 14/726,921, filed Jun. 1, 2015, 8 pages.
Notice of Allowance dated Mar. 14, 2019, issued in connection with U.S. Appl. No. 15/343,996, filed Nov. 4, 2016, 8 pages.
Notice of Allowance dated Jan. 15, 2019, issued in connection with U.S. Appl. No. 16/115,524, filed Aug. 28, 2018, 8 pages.
Notice of Allowance dated Jun. 15, 2017, issued in connection with U.S. Appl. No. 15/096,827, filed Apr. 12, 2016, 5 pages.
Notice of Allowance dated Mar. 15, 2017, issued in connection with U.S. Appl. No. 14/826,856, filed Aug. 14, 2015, 7 pages.
Notice of Allowance dated May 15, 2019, issued in connection with U.S. Appl. No. 16/113,032, filed Aug. 27, 2018, 9 pages.
Notice of Allowance dated Oct. 15, 2018, issued in connection with U.S. Appl. No. 15/716,313, filed Sep. 26, 2017, 10 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Oct. 16, 2019, issued in connection with U.S. Appl. No. 16/401,981, filed May 2, 2019, 8 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Oct. 17, 2019, issued in connection with U.S. Appl. No. 16/542,433, filed Aug. 16, 2019, 9 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644,136, filed Mar. 10, 2015, 12 pages.
Notice of Allowance dated Jun. 19, 2017, issued in connection with U.S. Appl. No. 14/793,190, filed Jul. 7, 2015, 5 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Oct. 11, 2017, issued in connection with U.S. Appl. No. 15/480,265, filed Apr. 5, 2017, 8 pages.

(56) References Cited

OTHER PUBLICATIONS

Non-Final Office Action dated Oct. 11, 2018, issued in connection with U.S. Appl. No. 15/856,791, filed Dec. 28, 2017, 13 pages.
Non-Final Office Action dated Sep. 12, 2016, issued in connection with U.S. Appl. No. 14/811,587, filed Jul. 28, 2015, 24 pages.
Non-Final Office Action dated Jul. 13, 2016, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Oct. 22, 2019, issued in connection with U.S. Appl. No. 16/416,619, filed May 20, 2019, 12 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings mailed on Nov. 15, 2018, issued in aonnection with European Application No. 16748186.0, 57 pages.
European Patent Office, Summons to Attend Oral Proceedings mailed on Sep. 24, 2019, issued in aonnection with European Application No. 17000460.0, 5 pages.
Ex Parte Quayle Office Action mailed on Apr. 15, 2019, issued in connection with U.S. Appl. No. 15/235,598, filed Aug. 12, 2016, 7 pages.
Ex Parte Quayle Office Action mailed on Dec. 26, 2019, issued in connection with U.S. Appl. No. 16/542,418, filed Aug. 16, 2019, 7 pages.
Final Office Action dated Dec. 2, 2019, issued in connection with U.S. Appl. No. 15/005,496, filed Jan. 25, 2016, 19 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Oct. 28, 2019, issued in connection with U.S. Appl. No. 16/181,865, filed Nov. 6, 2018, 17 pages.

(56) References Cited

OTHER PUBLICATIONS

Final Office Action dated Apr. 3, 2018, issued in connection with U.S. Appl. No. 15/235,598, filed Aug. 12, 2016, 12 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued in connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Searching Authority, International Preliminary Report on Patentability dated Mar. 23, 2017, issued in connection with International Patent Application No. PCT/US2015/048944, filed on Sep. 8, 2015, 8 pages.
International Searching Authority, International Preliminary Report on Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
Notice of Allowance dated Apr. 5, 2018, issued in connection with U.S. Appl. No. 15/681,640, filed Aug. 21, 2017, 8 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 8, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated May 8, 2018, issued in connection with U.S. Appl. No. 15/650,386, filed Jul. 14, 2017, 13 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision mailed on Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Ross, Alex, "Wizards of Sound: Retouching acoustics, from the restaurant to the concert hall," The New Yorker, Feb. 23, 2015. Web. Feb. 26, 2015, 9 pages.
Supplemental Notice of Allowability dated Oct. 27, 2016, issued in connection with U.S. Appl. No. 14/481,511, filed Sep. 9, 2014, 6 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.

(56) References Cited

OTHER PUBLICATIONS

Wikipedia, Server(Computing) https://web.archive.org/web/20160703173710/https://en.wikipedia.org/wiki/Server_(computing), published Jul. 3, 2016, 7 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Advisory Action dated Jul. 1, 2019, issued in connection with U.S. Appl. No. 15/229,693, filed Aug. 5, 2016, 2 pages.
Advisory Action dated Jul. 10, 2018, issued in connection with U.S. Appl. No. 15/056,553, filed Feb. 29, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 9, 2014, 3 pages.
Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.
An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, Retrieved Oct. 10, 2014, 3 pages.
Chinese Patent Office, First Office Action and Translation dated Jun. 19, 2019, issued in connection with Chinese Application No. 201680054189.X, 11 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Office Action dated Nov. 14, 2019, issued in connection with Chinese Application No. 201680040086.8, 9 pages.
Chinese Patent Office, Second Office Action and Translation dated Aug. 26, 2019, issued in connection with Chinese Application No. 201580047998.3, 25 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594.6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Dec. 11, 2018, issued in connection with European Application No. 15778787.0, 6 pages.
European Patent Office, European Office Action dated Jul. 11, 2019, issued in connection with European Application No. 15778787.0, 10 pages.
European Patent Office, European Office Action dated Nov. 2, 2018, issued in connection with European Application No. 18171206.8, 6 pages.
European Patent Office, European Office Action dated Jan. 3, 2020, issued in connection with European Application No. 17703876.7, 8 pages.
European Patent Office, European Office Action dated Feb. 4, 2019, issued in connection with European Application No. 17703876.7, 9 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Sep. 13, 2019, issued in connection with European Application No. 19161826.3, 13 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed on Jul. 20, 2016, 14 pages.

(56) References Cited

OTHER PUBLICATIONS

International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Nov. 23, 2015, issued in connection with International Application No. PCT/US2015/048942, filed on Sep. 8, 2015, 14 pages.
International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion dated Jan. 24, 2017, issued in connection with International Application No. PCT/US2016/052264, filed on Sep. 16, 2016, 17 pages.
International Searching Authority, International Search Report and Written Opinion dated Oct. 25, 2016, issued in connection with International Application No. PCT/US2016/043109, filed on Jul. 20, 2016, 12 pages.
International Searching Authority, International Search Report and Written Opinion dated Sep. 25, 2017, issued in connection with International Application No. PCT/US2017/042191, filed on Jul. 14, 2017, 16 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action and Translation dated Dec. 10, 2019, issued in connection with Japanese Patent Application No. 2018-213477, 8 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
John Mark and Paul Hufnagel "What is 1451.4, what are its uses and how does it work?" IEEE Standards Association, The IEEE 1451.4 Standard for Smart Transducers, 14pages.
Jones, Stephen, "Dell Digital Audio Receiver: Digital upgrade for your analog stereo," Analog Stereo, Jun. 24, 2000 retrieved Jun. 18, 2014, 2 pages.
"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2001.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Sep. 4, 2019, issued in connection with U.S. Appl. No. 16/213,552, filed Dec. 7, 2018, 16 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.

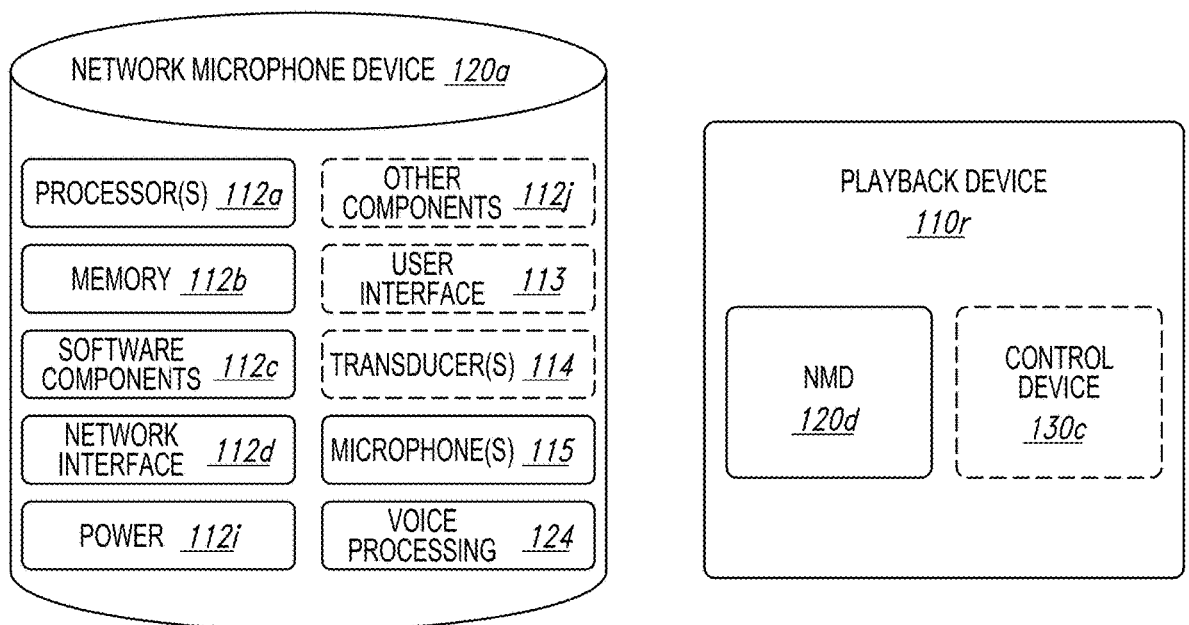
Fig. 1F
Fig. 1G
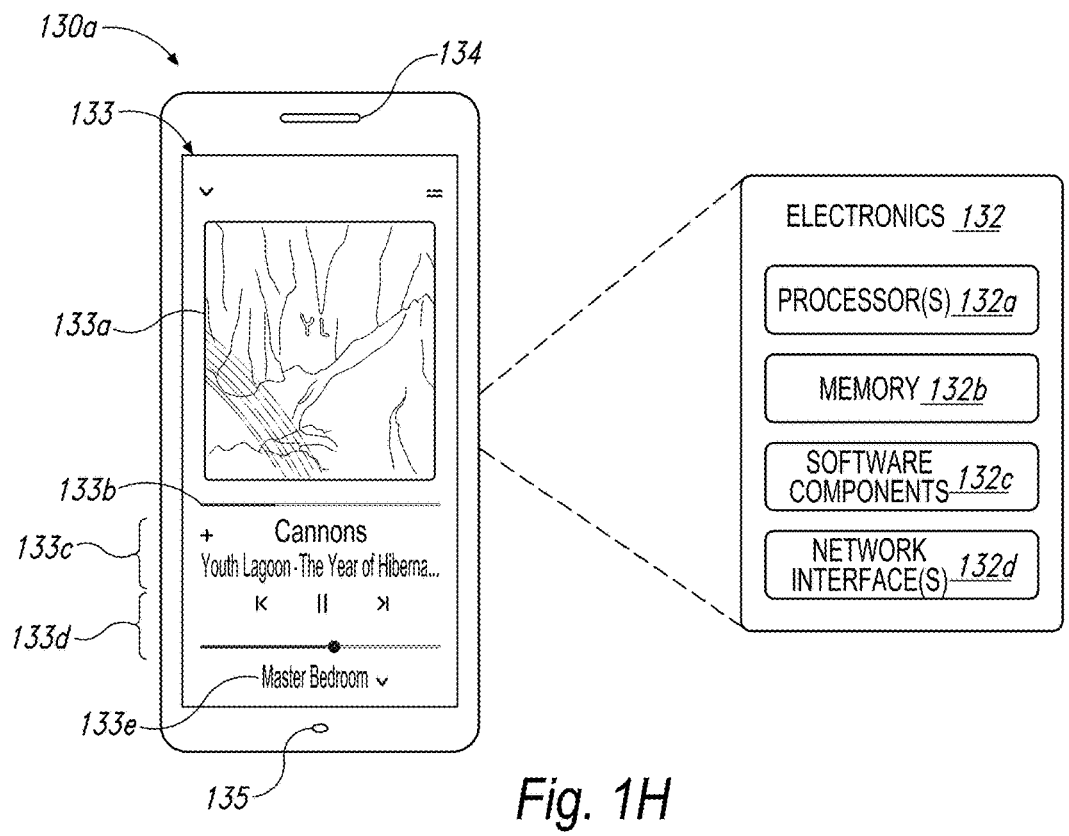
Fig. 1H

AUDIO CALIBRATION OF A PORTABLE PLAYBACK DEVICE

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of a network microphone device.

FIG. 1G is a block diagram of a playback device.

FIG. 1H is a partially schematic diagram of a control device.

Figure 1A:
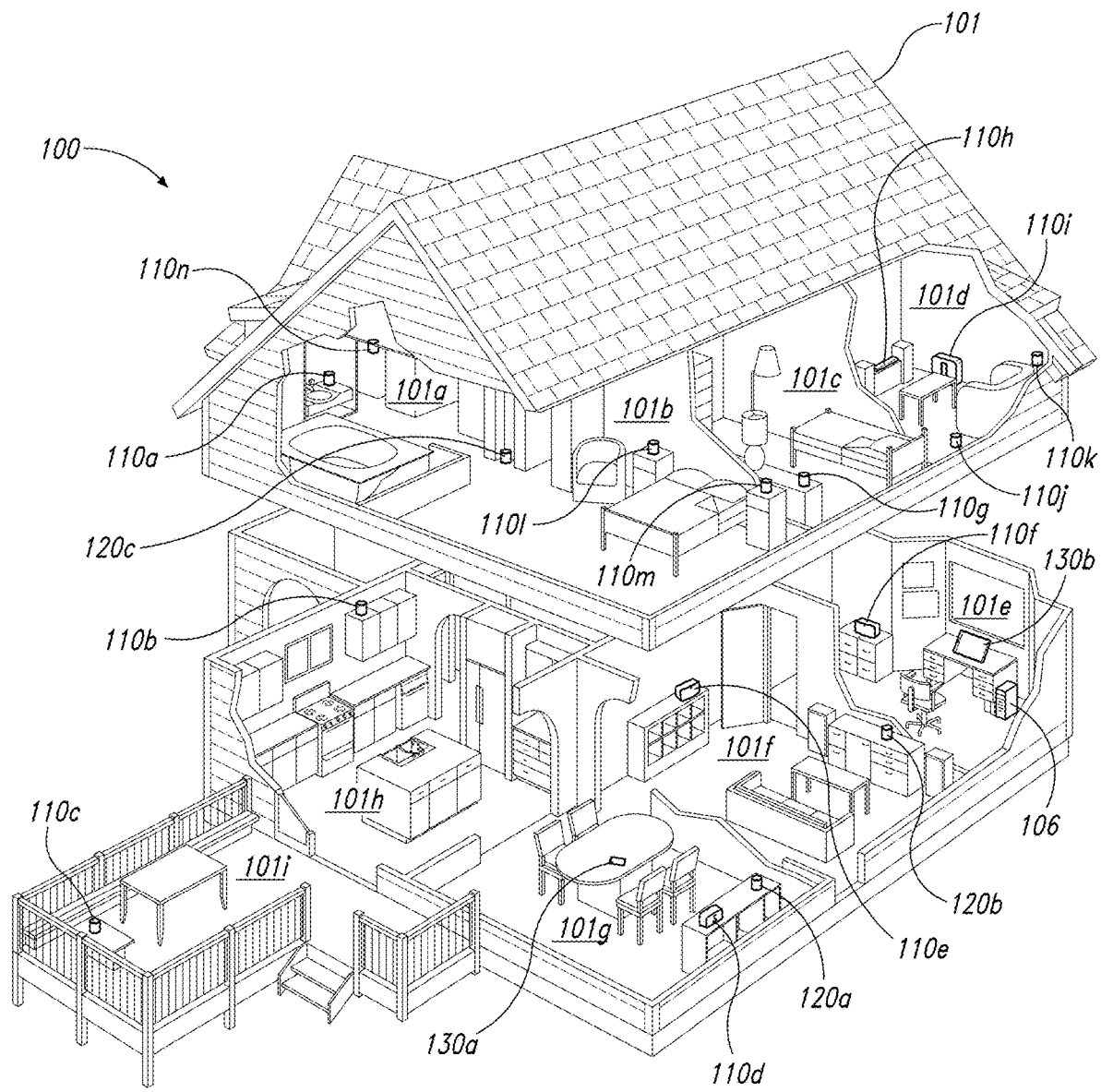
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Example techniques described herein relate to calibration of a portable playback device. Any environment has certain acoustic characteristics ("acoustics") that define how sound travels within that environment. For instance, with a room, the size and shape of the room, as well as objects inside that room, may define the acoustics for that room. For example, angles of walls with respect to a ceiling affect how sound reflects off the wall and the ceiling. As another example, furniture positioning in the room affects how the sound travels in the room. Various types of surfaces within the room may also affect the acoustics of that room; hard surfaces in the room may reflect sound, whereas soft surfaces may absorb sound.

Generally, changing a location of a playback device (e.g., by picking the playback device and setting it somewhere else) or rotating the playback device (e.g., to face a different direction) will cause output from a playback device to interact with the acoustic characteristics differently, as the response of environment acoustics to audio output of a playback device changes based on the positioning of the playback device. Accordingly, calibrating a playback device that is configured for portable use (where the playback device is more frequently re-positioned) may involve different considerations than calibrating a playback device that is expected to be generally stationary (e.g., on a bookshelf). Example calibration techniques described herein may be implemented in portable playback devices to facilitate calibration.

Given its portability, a portable playback device may be expected to change position and/or orientation relative to a listening environment relatively more frequently than a non-portable playback device (i.e., a wall-powered playback device). That is, to account for changing conditions of portable playback devices, a calibration process for a portable playback device may be initiated more frequently than, for example, a calibration process for a stationary playback device. In some examples, calibration of the portable playback device is initiated when the portable playback device is turned on, when the portable playback device plays music, or if the portable playback device has been moved to a new location.

To illustrate, if the portable playback device is moved to a new location, calibration of the portable playback device may be initiated based on a detection of the movement. Movement of the portable playback device may be detected by way of an accelerometer or, alternatively, based on a user input indicating that the portable playback device has moved to a new location. Conversely, calibration may be suspended when the portable playback device is in motion.

Further, in some examples, the portable playback device may be compatible with a playback device base. Placement or removal of the portable playback device on the playback device base may initiate or suspend calibration. In some examples, calibration of the playback device is initiated periodically, or after a threshold amount of time has elapsed after a previous calibration, in order to account for potential movement of the portable playback device and changes to the environment of the portable playback device. U.S. Pat. No. 9,544,701, entitled "Base Properties in a Media Playback System", hereby incorporated by reference in its entirety, provides examples of playback devices compatible with a base.

Example calibration processes, whether for a stationary or portable playback device, may involve a playback device outputting audio content while in a given environment (e.g., a room). The audio content may have predefined spectral content, such as a pink noise, a sweep, or a combination of content. Then, one or more microphones detect the outputted audio content to facilitate determining an acoustic response of the room (also referred to herein as a "room response").

In some examples, these microphones are located in a mobile device and the microphones detect outputted audio content at one or more different spatial positions in the room to facilitate determining an acoustic response of the room. In particular, a mobile device with a microphone, such as a smartphone or tablet (referred to herein as a network device) may be moved to the various locations in the room to detect the audio content. These locations may correspond to those locations where one or more listeners may experience audio playback during regular use (i.e., listening to) of the playback device. In this regard, the calibration process involves a user physically moving the network device to various locations in the room to detect the audio content at one or more spatial positions in the room. Given that this calibration involves moving the microphone to multiple locations throughout the room, this calibration may also be referred to as a "multi-location calibration" and it may generate a "multi-location acoustic response" representing room acoustics. U.S. Pat. No. 9,706,323 entitled, "Playback Device Calibration," U.S. Pat. No. 9,763,018 entitled, "Calibration of Audio Playback Devices,", and U.S. Pat. No. 10,299,061, entitled, "Playback Device Calibration," which are hereby incorporated by reference in their entirety, provide examples of multi-location calibration of playback devices to account for the acoustics of a room.

Based on a multi-location acoustic response, the media playback system may identify calibration settings (e.g., an audio processing algorithm). For instance, a network device may identify an audio processing algorithm, and transmit to the playback device, data indicating the identified audio processing algorithm. In some examples, the network device identifies an audio processing algorithm that, when applied to the playback device, results in audio content output by the playback device having a target audio characteristic, such as a target frequency response at one or more locations in the room.

The network device can identify the audio processing algorithm in various ways. In one case, the network device determines the audio processing algorithm based on the data indicating the detected audio content. In another case, the network device sends, to a computing device such as a server, data indicating the audio content detected at the various locations in the room, and receives, from the computing device, the audio processing algorithm after the server (or another computing device connected to the server) has determined the audio processing algorithm.

In some circumstances, performing a multi-location calibration process such as the one described above is not feasible or practical, particularly with respect to a portable playback device. For example, the portable playback device might not have access to a network device that is capable of or configured for performing such a calibration process. In some examples, the portable playback device may not have access to a network device at all. As such, the portable player must rely on its own processor and stored database to perform calibration. Further, in practice, a portable playback device may be relocated frequently and encounter changing environments and acoustic settings, as noted above.

As noted above, disclosed herein are example systems and methods to help address these or other issues with respect to calibration of portable playback devices. In particular, an example portable playback device in an environment may calibrate itself with respect to the environment without using a network device to detect audio content at various locations in the room and without leveraging a remote database. To do so, the playback device leverages one or more built-in microphones, and a locally-stored database of calibration settings (e.g., audio processing algorithms) and/or room responses (e.g. reference room responses) that includes a representation or generalization of previously generated data points for other playback devices using a calibration process, such as the process described above to determine a multi-location acoustic response.

The previously generated data points represent playback devices performing a multi-location calibration process similar to the process described above. Namely, the previously generated database is populated by performing the multi-location calibration process repeatedly in various locations in a plurality of different rooms or other listening environments (e.g., outdoors). To obtain a statistically sufficient collection of different room responses and corresponding calibration settings, this process can be performed by a large number of users in a larger number of different rooms. In some examples, an initial database may be built by designated individual (e.g., product testers) and refined over time by other users.

Since different playback devices have different output characteristics, these unique characteristics must be accounted for during the process of building the database. In some cases, the playback devices used in building the database are the portable playback devices themselves. Alternatively, a model can be developed to translate the output of other playback devices to represent the output of the portable playback devices.

As noted above, a portable playback device may include its own microphone(s). During the process of database building, the playback device uses its microphone(s) to record the audio output of the portable playback device concurrently with the recording by the microphones of the network device. This acoustic response determined by the playback device may be referred to as a "localized acoustic response," as the acoustic response is determined based on captured audio localized at the playback device, rather than at multiple locations throughout the room via the microphone of the network device. Such concurrent recording allows correlations to be made in the database between the localized acoustic responses detected by the microphone(s) in the playback device and the calibration settings based on the multi-location acoustic responses detected by the microphone(s) in the network device.

In practice, local storage of the entire collection of different room responses and corresponding calibration settings may not be feasible on portable playback devices, owing to cost and/or size considerations. As such, in example implementations, the portable playback device may include a generalization or representation of this larger remote database. Alternatively, a playback device may include a subset of the larger remote database.

In operation, after the database is built and stored locally on the playback device, the portable playback devices again use their own microphones to perform a self-calibration. In such a calibration, the portable playback device determines a localized acoustic response for the room by outputting audio content in the room and using a microphone of the playback device to detect reflections of the audio content within the room.

The playback device then queries the locally stored database to identify a stored localized acoustic response that is substantially similar to, or that is most similar to, the localized acoustic response determined by the playback device. In particular, the playback device may use the correlated localized responses to calculate or identify stored calibration settings corresponding to the instant determined localized acoustic response. The playback device then applies to itself the identified calibration settings that are associated in the database with the instant localized acoustic response.

In some implementations, for example, a playback device stores an acoustic response database comprising a plurality of sets of stored audio calibration settings, each set of stored audio calibration settings associated with a respective stored acoustic area response of a plurality of stored acoustic area responses. The playback device then determines that the playback device is to perform an equalization calibration of the playback device. In response to the determination that the playback device is to perform the equalization calibration, the playback device initiates the equalization calibration. The equalization calibration comprises (i) outputting, via the speaker, audio content (ii) capturing, via the microphone, audio data representing reflections of the audio content within an area in which the playback device is located (iii) based on at least the captured audio data, determining an acoustic response of the area in which the playback device is located, (iv) selecting a stored acoustic response from the acoustic response database that is most similar to the determined acoustic response of the area in which the playback device is located, and (v) applying to the audio content, a set of stored audio calibration settings associated with the selected stored acoustic area response.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs") 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-1H.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
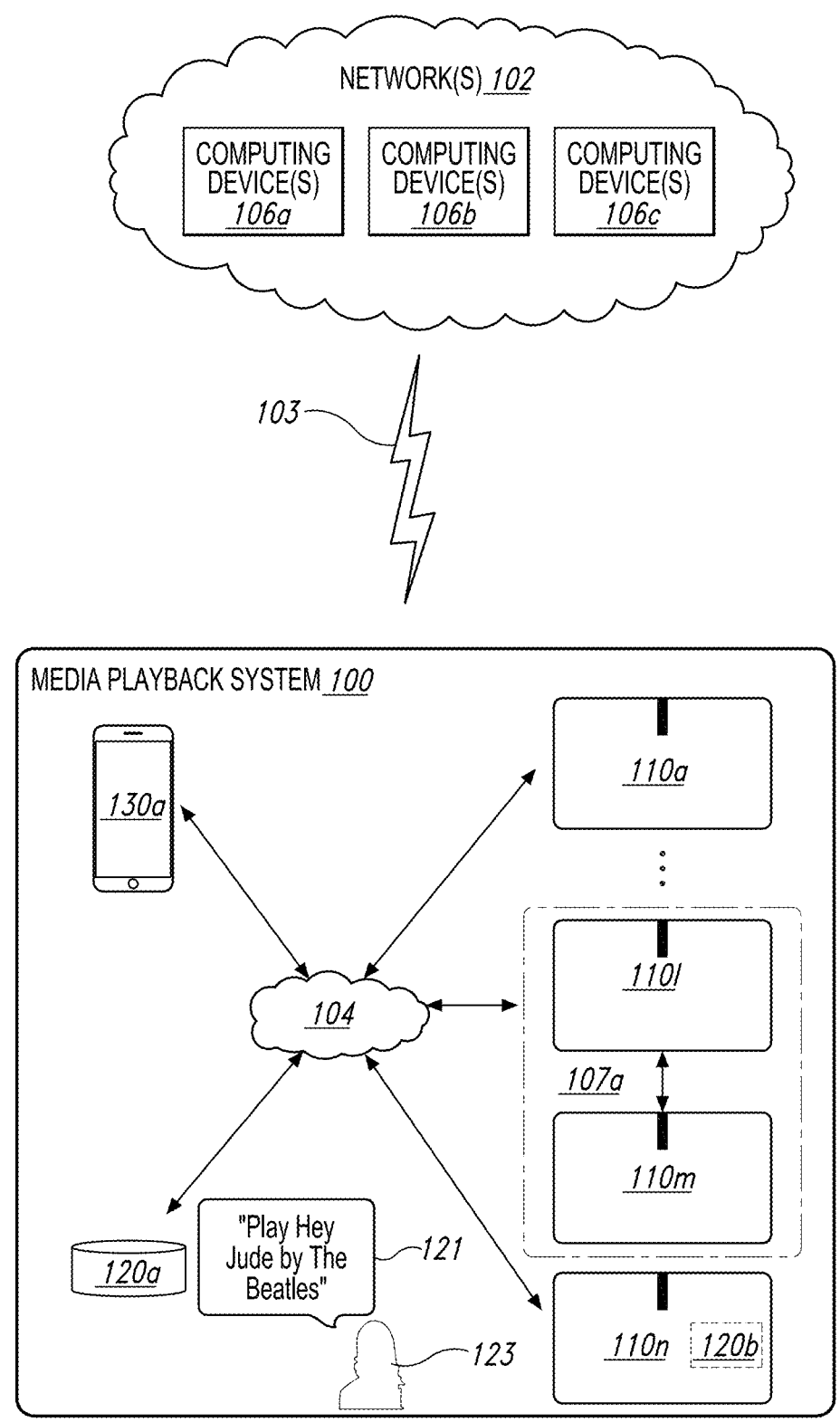
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain embodiments, for example, the group 107*a* comprises a bonded zone in which the playback devices 110*l* and 110*m* comprise left audio and right audio channels, respectively, of multi-channel audio content, thereby producing or enhancing a stereo effect of the audio content. In some embodiments, the group 107*a* includes additional playback devices 110. In other embodiments, however, the media playback system 100 omits the group 107*a* and/or other grouped arrangements of the playback devices 110.

The media playback system 100 includes the NMDs 120*a* and 120*d*, each comprising one or more microphones configured to receive voice utterances from a user. In the illustrated embodiment of FIG. 1B, the NMD 120*a* is a standalone device and the NMD 120*d* is integrated into the playback device 110*n*. The NMD 120*a*, for example, is configured to receive voice input 121 from a user 123. In some embodiments, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
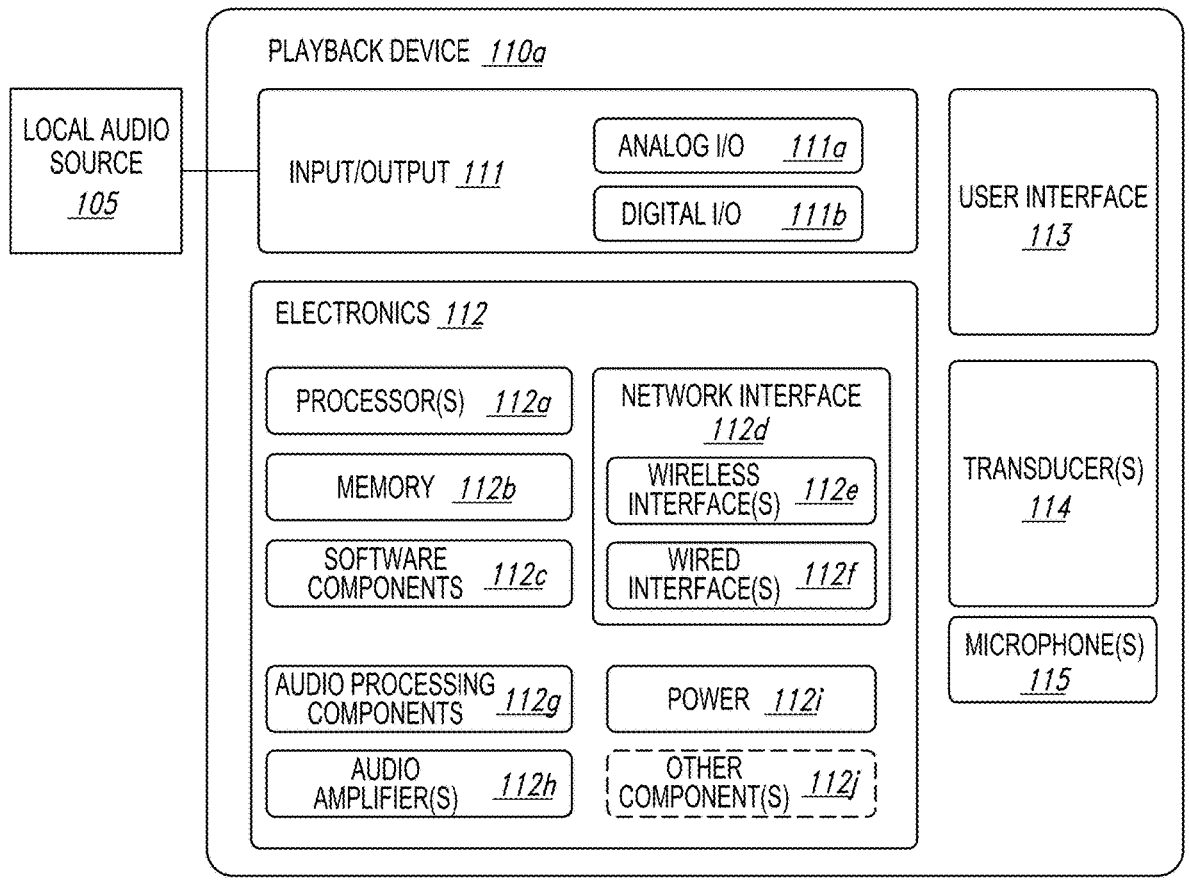
FIG. 1C is a block diagram of a playback device.

FIG. 1C is a block diagram of the playback device 110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some embodiments, the analog I/O 111*a* is an audio line-in input connection comprising, for example, an auto-detecting 3.5 mm audio line-in connection. In some embodiments, the digital I/O 111*b* comprises a Sony/Philips Digital Interface Format (S/PDIF) communication interface and/or cable and/or a Toshiba Link (TOSLINK) cable. In some embodiments, the digital I/O 111*b* comprises an High-Definition Multimedia Interface (HDMI) interface and/or cable. In some embodiments, the digital I/O 111*b* includes one or more wireless communication links comprising, for example, a radio frequency (RF), infrared, WiFi, Bluetooth, or another suitable communication protocol. In certain embodiments, the analog I/O 111*a* and the digital 111*b* comprise interfaces (e.g., ports, plugs, jacks) configured to receive connectors of cables transmitting analog and digital signals, respectively, without necessarily including cables.

The playback device 110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110*a* does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B)), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
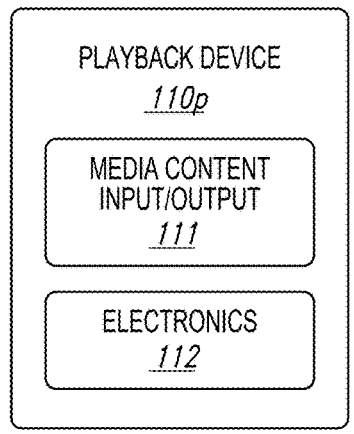
FIG. 1D is a block diagram of a playback device.

By way of illustration, SONOS, Inc. presently offers (or has offered) for sale certain playback devices including, for example, a "SONOS ONE," "PLAY:1," "PLAY:3," "PLAY:5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
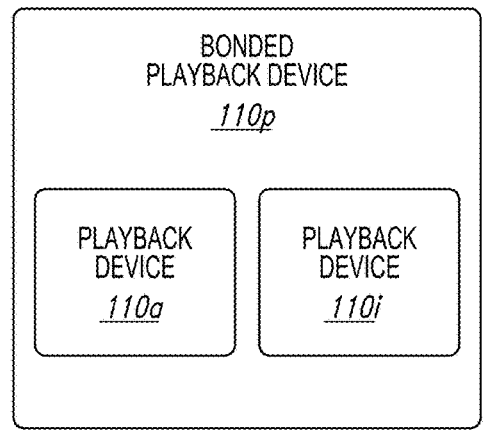
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with the first playback device, is configured to render only the mid-range and high frequency components of a particular audio content, while the playback device 110i renders the low frequency component of the particular audio content. In some embodiments, the bonded playback device 110q includes additional playback devices and/or another bonded playback device.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the amplifiers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B).

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 132a to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 130a to one or more of the playback devices 100. The network interface 132d can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others.

The user interface 133 is configured to receive user input and can facilitate 'control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

III. Example Systems and Methods for Calibrating a Playback Device

As discussed above, in some examples, a playback device is configured to calibrate itself to offset (or otherwise account for) an acoustic response of a room in which the playback device is located. The playback device performs this self-calibration by leveraging a database that is populated with calibration settings and/or reference room responses that were determined for a number of other playback devices. In some embodiments, the calibration settings and/or reference room responses stored in the database are determined based on multi-location acoustic responses for the rooms of the other playback devices recorded previously on mobile devices, such as a smart phone or tablet.

Figure 2A:
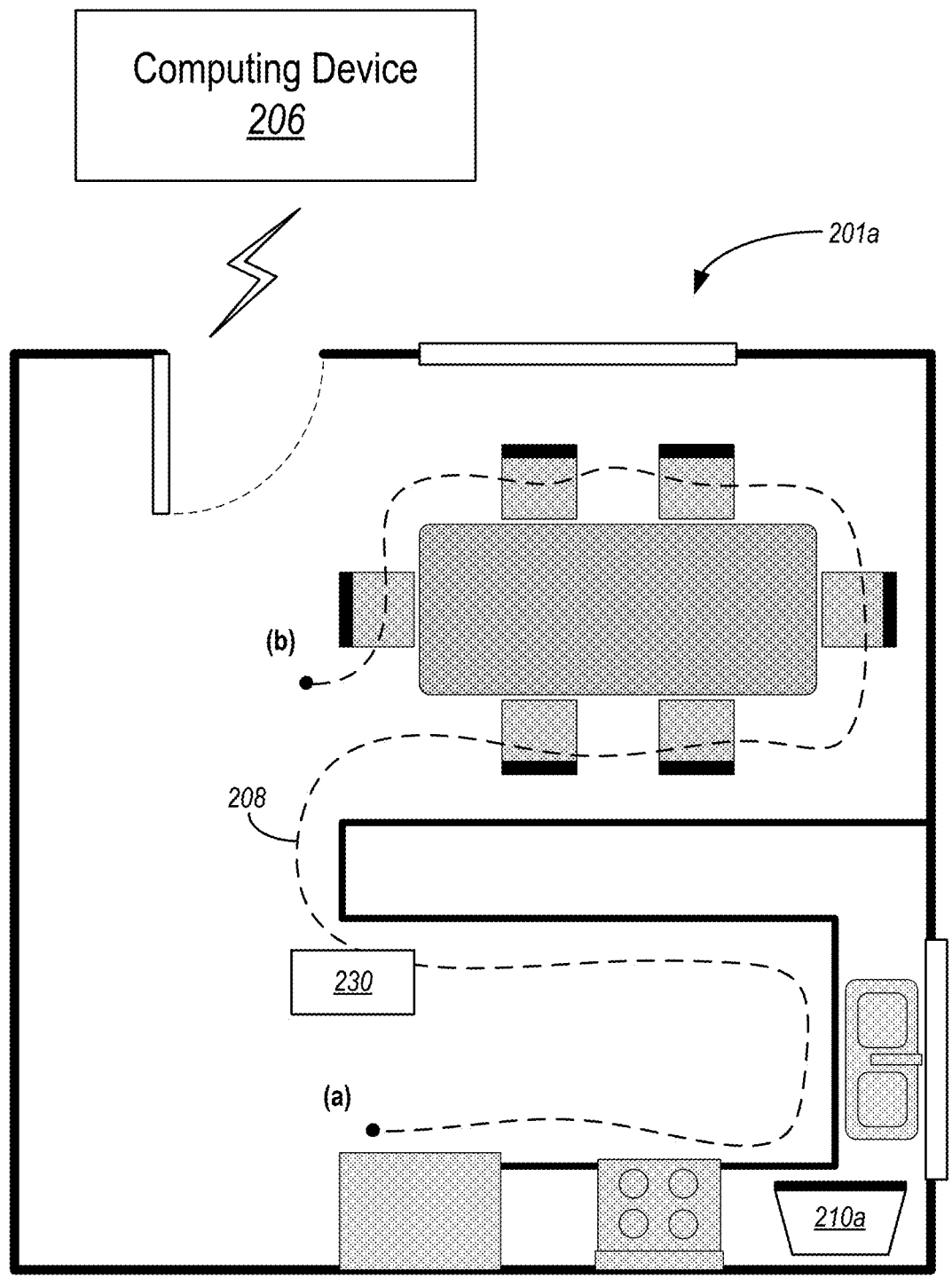
FIG. 2A is a diagram of a playback environment within which a playback device may be calibrated.

FIG. 2A depicts an example environment for using a multi-location acoustic response of a room to determine calibration settings for a playback device. As shown in FIG. 2A, a playback device 210a and a network device 230 are located in a room 201a. The playback device 210a may be similar to any of the playback devices 110 depicted in FIGS. 1A-1E and 1G, and the network device 230 may be similar to any of the NMDs 120 or controllers 130 depicted in FIGS. 1A-1B and 1F-1H. One or both of the playback device 210a and the network device 230 are in communication, either directly or indirectly, with a computing device 206. The computing device 206 may be similar to any of the computing devices 106 depicted in FIG. 1B. For instance, the computing device 206 may be a server located remotely from the room 201a and connected to the playback device 210a and/or the network device 230 over a wired or wireless communication network.

In practice, the playback device 210a outputs audio content via one or more transducers (e.g., one or more speakers and/or speaker drivers) of the playback device 210a. In one example, the audio content is output using a test signal or measurement signal representative of audio content that may be played by the playback device 210a during regular use by a user. Accordingly, the audio content may include content with frequencies substantially covering a renderable frequency range of the playback device 210a or a frequency range audible to a human. In one case, the audio content is output using an audio signal designed specifically for use when calibrating playback devices such as the playback device 210a being calibrated in examples discussed herein. In another case, the audio content is an audio track that is a favorite of a user of the playback device 210a, or a commonly played audio track by the playback device 210a. Other examples are also possible.

While the playback device 210a outputs the audio content, the network device 230 moves to various locations within the room 201a. For instance, the network device 230 may move between a first physical location and a second physical location within the room 201a. As shown in FIG. 2A, the first physical location may be the point (a), and the second physical location may be the point (b). While moving from the first physical location (a) to the second physical location (b), the network device 230 may traverse locations within the room 201a where one or more listeners may experience audio playback during regular use of the playback device 210a. For instance, as shown, the room 201a includes a kitchen area and a dining area, and a path 208 between the first physical location (a) and the second physical location (b) covers locations within the kitchen area and dining area where one or more listeners may experience audio playback during regular use of the playback device 210a.

In some examples, movement of the network device 230 between the first physical location (a) and the second physical location (b) may be performed by a user. In one case, a graphical display of the network device 230 may provide an indication to move the network device 230 within the room 201a. For instance, the graphical display may display text, such as "While audio is playing, please move the network device through locations within the playback zone where you or others may enjoy music." Other examples are also possible.

The network device 230 determines a multi-location acoustic response of the room 201a. To facilitate this, while the network device 230 is moving between physical locations within the room 201a, the network device 230 captures audio data representing reflections of the audio content output by the playback device 210a in the room 201a. For instance, the network device 230 may be a mobile device with a built-in microphone (e.g., microphone(s) 115 of network microphone device 120a), and the network device 230 may use the built-in microphone to capture the audio data representing reflections of the audio content at multiple locations within the room 201a.

The multi-location acoustic response is an acoustic response of the room 201a based on the detected audio data representing reflections of the audio content at multiple locations in the room 201a, such as at the first physical location (a) and the second physical location (b). The multi-location acoustic response may be represented as a spectral response, spatial response, or temporal response, among others. The spectral response may be an indication of how volume of audio sound captured by the microphone varies with frequency within the room 201*a*.

A power spectral density is an example representation of the spectral response. The spatial response may indicate how the volume of the audio sound captured by the microphone varies with direction and/or spatial position in the room 201*a*. The temporal response may be an indication of how audio sound played by the playback device 210*a*, e.g., an impulse sound or tone played by the playback device 210*a*, changes within the room 201*a*. The change may be characterized as a reverberation, delay, decay, or phase change of the audio sound.

The responses may be represented in various forms. For instance, the spatial response and temporal responses may be represented as room averages. Additionally, or alternatively, the multi-location acoustic response may be represented as a set of impulse responses or bi-quad filter coefficients representative of the acoustic response, among others. Values of the multi-location acoustic response may be represented in vector or matrix form.

Audio played by the playback device 210*a* is adjusted based on the multi-location acoustic response of the room 201*a* so as to offset or otherwise account for acoustics of the room 201*a* indicated by the multi-location acoustic response. In particular, the multi-location acoustic response is used to identify calibration settings, which may include determining an audio processing algorithm. U.S. Pat. No. 9,706,323, incorporated by reference above, discloses various audio processing algorithms, which are contemplated herein.

In some examples, determining the audio processing algorithm involves determining an audio processing algorithm that, when applied to the playback device 210*a*, causes audio content output by the playback device 210*a* in the room 201*a* to have a target frequency response. For instance, determining the audio processing algorithm may involve determining frequency responses at the multiple locations traversed by the network device while moving within the room 201*a* and determining an audio processing algorithm that adjusts the frequency responses at those locations to more closely reflect target frequency responses. In one example, if one or more of the determined frequency responses has a particular audio frequency that is more attenuated than other frequencies, then determining the audio processing algorithm may involve determining an audio processing algorithm that increases amplification at the particular audio frequency. Other examples are possible as well.

In some examples, the audio processing algorithm takes the form of a filter or equalization. The filter or equalization may be applied by the playback device 210*a* (e.g., via audio processing components 112*g*). Alternatively, the filter or equalization may be applied by another playback device, the computing device 206, and/or the network device 230, which then provides the processed audio content to the playback device 210*a* for output. The filter or equalization may be applied to audio content played by the playback device 210*a* until such time that the filter or equalization is changed or is no longer valid for the room 201*a*.

The audio processing algorithm may be stored in a database of the computing device 206 or may be calculated dynamically. For instance, in some examples, the network device 230 sends to the computing device 206 the detected audio data representing reflections of the audio content at multiple locations in the room 201*a*, and receives, from the computing device 206, the audio processing algorithm after the computing device 206 has determined the audio processing algorithm. In other examples, the network device 230 determines the audio processing algorithm based on the detected audio data representing reflections of the audio content at multiple locations in the room 201*a*.

Further, while the network device 230 captures audio data at multiple locations in the room 201*a* for determining the multi-location acoustic response of the room 201*a*, the playback device 210*a* concurrently captures audio data at a stationary location for determining a localized acoustic response of the room 201*a*. To facilitate this, the playback device 210*a* may have one or more microphones, which may be fixed in location. For example, the one or more microphones may be co-located in or on the playback device 210*a* (e.g., mounted in a housing of the playback device) or be co-located in or on an NMD proximate to the playback device 210*a*. Additionally, the one or more microphones may be oriented in one or more directions. The one or more microphones detect audio data representing reflections of the audio content output by the playback device 210*a* in the room 201*a*, and this detected audio data is used to determine the localized acoustic response of the room 201*a*.

The localized acoustic response is an acoustic response of the room 201*a* based on the detected audio data representing reflections of the audio content at a stationary location in the room. The stationary location may be at the one or more microphones located on or proximate to the playback device 210*a*, but could also be at the microphone of an NMD or a controller device proximate to the playback device 210*a*.

The localized acoustic response may be represented as a spectral response, spatial response, or temporal response, among others. The spectral response may be an indication of how volume of audio sound captured by the microphone varies with frequency within the room 201*a*. A power spectral density is an example representation of the spectral response. The spatial response may indicate how the volume of the audio sound captured by the microphone varies with direction and/or spatial position in the room 201*a*. The temporal response may be an indication of how audio sound played by the playback device 210*a*, e.g., an impulse sound or tone played by the playback device 210*a*, changes within the room 201*a*. The change may be characterized as a reverberation, delay, decay, or phase change of the audio sound. The spatial response and temporal response may be represented as averages in some instances. Additionally, or alternatively, the localized acoustic response may be represented as a set of impulse responses or bi-quad filter coefficients representative of the acoustic response, among others. Values of the localized acoustic response may be represented in vector or matrix form.

Once the multi-location calibration settings for the playback device 210*a* and the localized acoustic response of the room 201*a* are determined, this data is then provided to a computing device, such as computing device 206, for storage in a database. For instance, the network device 230 may send the determined multi-location calibration settings to the computing device 206, and the playback device 210*a* may send the localized acoustic response of the room 201*a* to the computing device 206. In other examples, the network device 230 or the playback device 210*a* sends both the determined multi-location calibration settings and the localized acoustic response of the room 201*a* to the computing device 206. Other examples are possible as well.

Figure 2B:
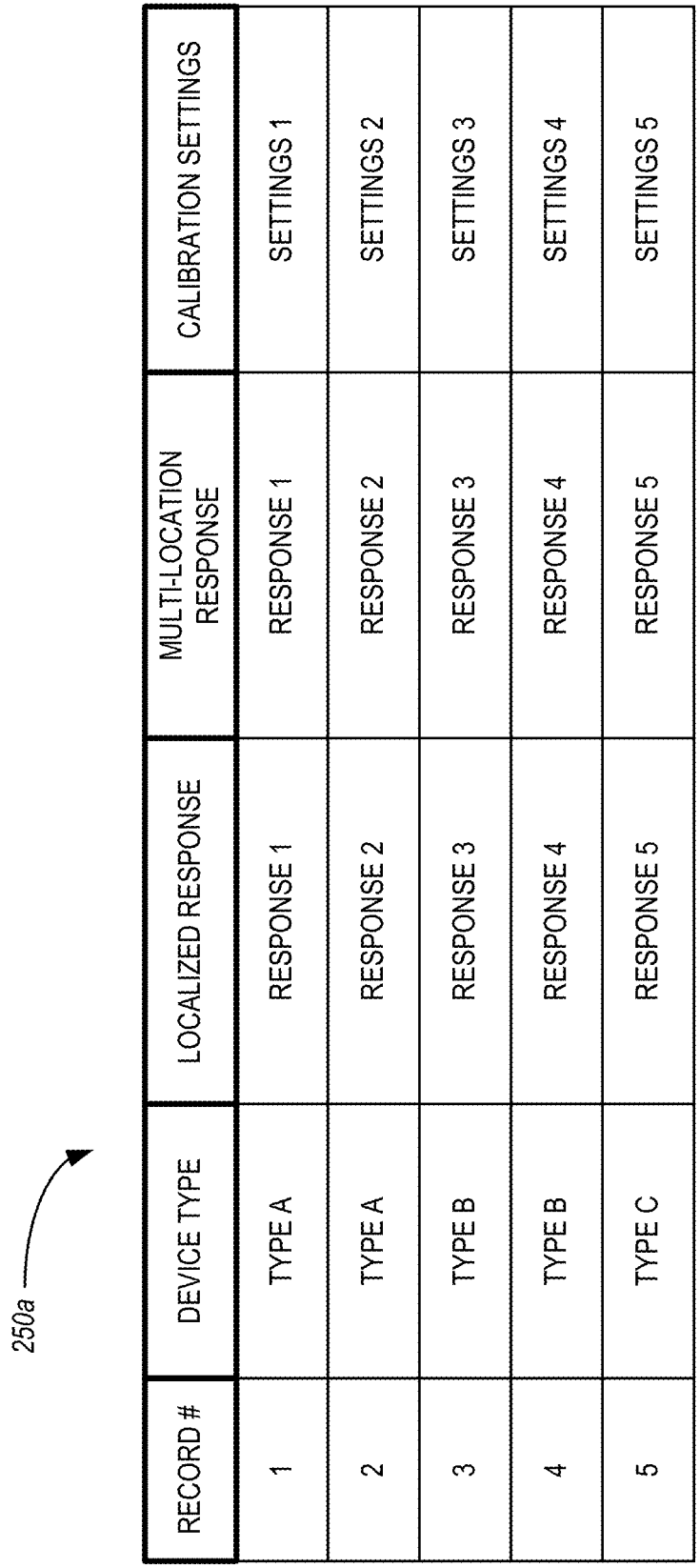
FIG. 2B is a representation of a database for storing room response data and corresponding playback device calibration settings.

FIG. 2B depicts a representation of an example database 250*a* for storing both the determined multi-location calibration settings for the playback device 210a and the localized acoustic response of the room 201a.

The database 250a may be stored on a computing device, such as computing device 206, located remotely from the playback device 210a and/or from the network device 230, or the database 250a may be stored on the playback device 210a and/or the network device 230. The database 250a includes a number of records, and each record includes data representing multi-location calibrations settings (identified as "settings 1" through "settings 5") for various playback devices as well as localized room responses (identified as "response 1A" through "response 5A"), and multi-location acoustic responses (identified as "response 1B through "response 5B), associated with the multi-location calibration settings. For the purpose of illustration, the database 250a only depicts five records (numbered 1-5), but in practice should include many more than five records to improve the accuracy of the calibration processes described in further detail below.

When the computing device 206 receives data representing the multi-location calibration settings for the playback device 210a and data representing the localized acoustic response of the room 201a, the computing device 206 stores the received data in a record of the database 250a. As an example, the computing device 206 stores the received data in record #1 of the database 250a, such that "response 1" includes data representing the localized acoustic response of the room 201a, and "settings 1" includes data representing the multi-location calibration settings for the playback device 210a. In some cases, the database 250a also includes data representing respective multi-location acoustic responses associated with the localized acoustic responses and the corresponding multi-location calibration settings. For instance, if record #1 of database 250a corresponds to playback device 210a, then "response 1" may include data representing both the localized acoustic response of the room 201a and the multi-location acoustic response of the room 201a.

As indicated above, each record of the database 250a corresponds to a historical playback device calibration process in which a particular playback device was calibrated by determining calibration settings based on a multi-location acoustic response, as described above in connection with FIG. 2A. The calibration processes are "historical" in the sense that they relate to multi-location calibration settings and localized acoustic responses determined for rooms with various types of acoustic characteristics previously determined and stored in the database 250a. As additional iterations of the calibration process are performed, the resulting multi-location calibration settings and localized acoustic responses may be added to the database 250a.

As shown in the database 250a, the localized room response and the calibration settings based on the multi-location calibration are correlated. In operation, portable playback devices may leverage the historical multi-location calibration settings and localized acoustic responses stored in the database 250a in order to self-calibrate to account for the acoustic responses of the rooms in which they are located. During calibration of a portable playback device, the portable playback device uses its internal microphone(s) to record its own audio output and determines an instant localized response. This instant localized response can be compared to the localized room responses to determine a similar localized room response (i.e., a response that most similar), and thereby identify corresponding calibration settings based on a multi-location calibration. The playback device then applies to itself the multi-location calibration settings stored in the database 250a that are associated with the identified record.

Efficacy of the applied calibration settings is influenced by a degree of similarity between the identified stored acoustic response in the database 250a and the determined acoustic response for the playback device being calibrated. In particular, if the acoustic responses are significantly similar or identical, then the applied calibration settings are more likely to accurately offset or otherwise account for an acoustic response of the room in which the playback device being calibrated is located (e.g., by achieving or approaching a target frequency response in the room, as described above). On the other hand, if the acoustic responses are relatively dissimilar, then the applied calibration settings are less likely to accurately account for an acoustic response of the room in which the playback device being calibrated is located. Accordingly, populating the database 250a with records corresponding to a significantly large number of historical calibration processes may be desirable so as to increase the likelihood of the database 250a including acoustic response data similar to an acoustic response of the room of the playback device presently being calibrated.

As further shown, in some examples, the database 250a includes data identifying a type of a playback device associate with each record. Playback device "type" refers to a model and/or revision of a model, as well as different models that are designed to produce similar audio output (e.g., playback devices with similar components), among other examples. The type of the playback device may be indicated when providing the calibration settings and room response data to the database 250a. As an example, in addition to the network device 230 and/or the playback device 210a sending data representing the multi-location calibration settings for the playback device 210a and data representing the localized acoustic response of the room 201a to the computing device 206, the network device 230 and/or the playback device 210a also sends data representing a type of the playback device 210a to the computing device. Examples of playback device types offered by Sonos, Inc. include, by way of illustration, various models of playback devices such as a "SONOS ONE," "PLAY:1," "PLAY:3," "PLAY:5," "PLAYBAR," "PLAYBASE," "CONNECT: AMP," "CONNECT," and "SUB," among others.

In some examples, the data identifying the type of the playback device additionally or alternatively includes data identifying a configuration of the playback device. For instance, as described above in connection with FIG. 1E, a playback device may be a bonded or paired playback device configured to process and reproduce sound differently than an unbonded or unpaired playback device. Accordingly, in some examples, the data identifying the type of the playback device 210a includes data identifying whether the playback device 210a is in a bonded or paired configuration.

By storing in the database 250a data identifying the type of the playback device, the database 250a may be more quickly searched by filtering data based on playback device type, as described in further detail below. However, in some examples, the database 250a does not include data identifying the device type of the playback device associated with each record.

In some implementations, calibrations settings for a first type of playback device may be used for a second type of playback device, provided that a model is created to translate from the first type to the second type. The model may include a transfer function that transfers a response of a first type of playback device to a response of a second type of playback device. Such models may be determined by comparing responses of the two types of playback devices in an anechoic chamber and determining a transfer function that translates between the two responses.

Figure 2C:
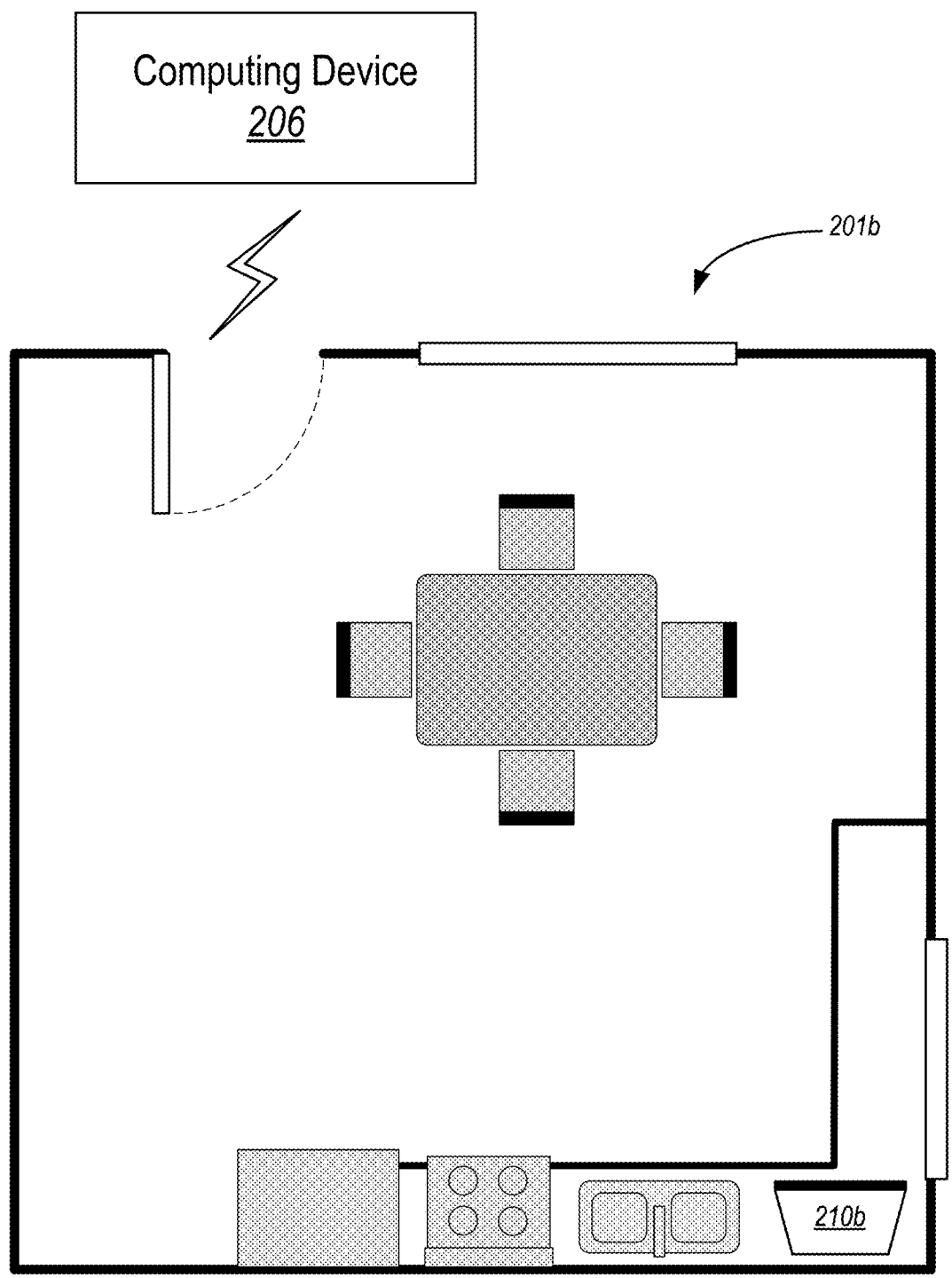
FIG. 2C is a diagram of a playback environment within which a playback device may be calibrated.

FIG. 2C depicts an example environment in which a playback device 210b leverages the database 250a to perform a self-calibration process without determining a multi-location acoustic response of its room 201b.

In one example, the self-calibration of the playback device 210b may be initiated when the playback device 210b is being set up for the first time in the room 201b, when the playback device 210b first outputs music or some other audio content, or if the playback device 210b has been moved to a new location. For instance, if the playback device 210b is moved to a new location, calibration of the playback device 210b may be initiated based on a detection of the movement (e.g., via a global positioning system (GPS), one or more accelerometers, or wireless signal strength variations), or based on a user input indicating that the playback device 210b has moved to a new location (e.g., a change in playback zone name associated with the playback device 210b).

In another example, calibration of the playback device 210b may be initiated via a controller device, such as the controller device 130a depicted in FIG. 1H. For instance, a user may access a controller interface for the playback device 210b to initiate calibration of the playback device 210b. In one case, the user may access the controller interface, and select the playback device 210b (or a group of playback devices that includes the playback device 210b) for calibration. In some cases, a calibration interface may be provided as part of a playback device controller interface to allow a user to initiate playback device calibration. Other examples are also possible.

Further, in some examples, calibration of the playback device 210b is initiated periodically, or after a threshold amount of time has elapsed after a previous calibration, in order to account for changes to the environment of the playback device 210b. For instance, a user may change a layout of the room 201b (e.g., by adding, removing, or rearranging furniture), thereby altering the acoustic response of the room 201b. As a result, any calibration settings applied to the playback device 210b before the room 201b is altered may have a reduced efficacy of accounting for, or offsetting, the altered acoustic response of the room 201b. Initiating calibration of the playback device 210b periodically, or after a threshold amount of time has elapsed after a previous calibration, can help address this issue by updating the calibration settings at a later time (i.e., after the room 201b is altered) so that the calibration settings applied to the playback device 210b are based on the altered acoustic response of the room 201b.

Additionally, because calibration of the playback device 210b involves accessing and retrieving calibration settings from the database 250a, as described in further detail below, initiating calibration of the playback device 210b periodically, or after a threshold amount of time has elapsed after a previous calibration, may further improve a listening experience in the room 201b by accounting for changes to the database 250a. For instance, as users continue to calibrate various playback devices in various rooms, the database 250a continues to be updated with additional acoustic room responses and corresponding calibration settings. As such, a newly added acoustic response (i.e., an acoustic response that is added to the database 250a after the playback device 210b has already been calibrated) may more closely resemble the acoustic response of the room 201b.

Thus, by initiating calibration of the playback device 210b periodically, or after a threshold amount of time has elapsed after a previous calibration, the calibration settings corresponding to the newly added acoustic response may be applied to the playback device 210b. Accordingly, in some examples, the playback device 210b determines that at least a threshold amount of time has elapsed after the playback device 210b has been calibrated, and, responsive to making such a determination, the playback device 210b initiates a calibration process, such as the calibration processes described below.

When performing the calibration process, the playback device 210b outputs audio content and determines a localized acoustic response of its room 201b similarly to how playback device 210a determined a localized acoustic response of room 201a. For instance, the playback device 210b outputs audio content, which may include music or one or more predefined tones, captures audio data representing reflections of the audio content within the room 201b, and determines the localized acoustic response based on the captured audio data.

Causing the playback device 210b to output spectrally rich audio content during the calibration process may yield a more accurate localized acoustic response of the room 201b. Thus, in examples where the audio content includes predefined tones, the playback device 210b may output predefined tones over a range of frequencies for determining the localized acoustic response of the room 201b. And in examples where the audio content includes music, such as music played during normal use of the playback device 210b, the playback device 210b may determine the localized acoustic response based on audio data that is captured over an extended period of time.

For instance, as the playback device 210b outputs music, the playback device 210b may continue to capture audio data representing reflections of the output music within the room 201b until a threshold amount of data at a threshold amount of frequencies is captured. Depending on the spectral content of the output music, the playback device 210b may capture the reflected audio data over the course of multiple songs, for instance, in order for the playback device 210b to have captured the threshold amount of data at the threshold amount of frequencies. In this manner, the playback device 210b gradually learns the localized acoustic response of the room 201b, and once a threshold confidence in understanding of the localized acoustic response of the room 201b is met, then the playback device 210b uses the localized acoustic response of the room 201b to determine calibration settings for the playback device 210b, as described in further detail below.

While outputting the audio content, the playback device 210b uses one or more stationary microphones, which may be disposed in or on a housing of the playback device 210b or may be co-located in or on an NMD proximate to the playback device 210b, to capture audio data representing reflections of the audio content in the room 201b. The playback device 210b then uses the captured audio data to determine the localized acoustic response of the room 201b. In line with the discussion above, the localized acoustic response may include a spectral response, spatial response, or temporal response, among others, and the localized acoustic response may be represented in vector or matrix form.

In some embodiments, determining the localized acoustic response of the room 201b involves accounting for a self-response of the playback device 210b or of a microphone of the playback device 210b, for example, by processing the captured audio data representing reflections of the audio content in the room 201b so that the captured audio data reduces or excludes the playback device's native influence on the audio reflections.

In one example, the self-response of the playback device 210b is determined in an anechoic chamber, or is otherwise known based on a self-response of a similar playback device being determined in an anechoic chamber. In the anechoic chamber, audio content output by the playback device 210b is inhibited from reflecting back toward the playback device 210b, so that audio captured by a microphone of the playback device 210b is indicative of the self-response of the playback device 210b or of the microphone of the playback device 210b. Knowing the self-response of the playback device 210b or of the microphone of the playback device 210b, the playback device 210b offsets such a self-response from the captured audio data representing reflections of the first audio content when determining the localized acoustic response of the room 201b.

Once the localized acoustic response of the room 201b is known, the playback device 210b accesses the database 250a to determine a set of calibration settings to account for the acoustic response of the room 201b. More specifically, the playback device 210b determines a recorded and stored localized acoustic response recorded during a previous multi-location calibration which is within a threshold similarity (e.g., most similar to) the localized acoustic response of the room 201b. For example, the playback device 210b establishes a connection with the computing device 206 and with the database 250a of the computing device 206, and the playback device 210b queries the database 250a for a stored acoustic room response that corresponds to the determined localized acoustic response of the room 201b.

In some examples, querying the database 250a involves mapping the determined localized acoustic response of the room 201b to a particular stored acoustic room response in the database 250a that satisfies a threshold similarity to the localized acoustic response of the room 201b. This mapping may involve comparing values of the localized acoustic response to values of the stored localized acoustic room responses and determining which of the stored localized acoustic room responses are similar to the instant localized acoustic response. For example, in implementations where the acoustic responses are represented as vectors, the mapping may involve determining distances between the localized acoustic response vector and the stored acoustic response vectors. In such a scenario, the stored acoustic response vector having the smallest distance from the localized acoustic response vector of the room 201b may be identified as satisfying the threshold similarity. In some examples, one or more values of the localized acoustic response of the room 201b may be averaged and compared to corresponding averaged values of the stored acoustic responses of the database 250a. In such a scenario, the stored acoustic response having averaged values closest to the averaged values of the localized acoustic response vector of the room 201b may be identified as satisfying the threshold similarity. Other examples are possible as well.

As shown, the room 201b depicted in FIG. 2C and the room 201a depicted in FIG. 2A are similarly shaped and have similar layouts. Further, the playback device 210b and the playback device 210a are arranged in similar positions in their respective rooms. As such, when the localized room response determined by playback device 210b for room 201b is compared to the room responses stored in the database 250a, the computing device 206 may determine that the localized room response determined by playback device 210a for room 201a has at least a threshold similarity to the localized room response determined by playback device 210b for room 201b.

In some examples, querying the database 250a involves querying only a portion of the database 250a. For instance, as noted above, the database 250a may identify a type or configuration of playback device for which each record of the database 250a is generated. Playback devices of the same type or configuration may be more likely to have similar room responses and may be more likely to have compatible calibration settings. Accordingly, in some embodiments, when the playback device 210b queries the database 250a for comparing the localized acoustic response of the room 201b to the stored room responses of the database 250a, the playback device 210b might only compare the localized acoustic response of the room 201b to stored room responses associated with playback devices of the same type or configuration as the playback device 210b.

Once a stored acoustic room response of the database 250a is determined to be threshold similar to the localized acoustic response of the room 201b, then the playback device 210b identifies a set of calibration settings associated with the threshold similar stored acoustic room response. For instance, as shown in FIG. 2B, each stored acoustic room response is included as part of a record that also includes a set of calibration settings designed to account for the room response. As such, the playback device 210b retrieves, or otherwise obtains from the database 250a, the set of calibration settings that share a record with the threshold similar stored acoustic room response and applies the set of calibration settings to itself. Alternatively, the playback device 201b may determine (i.e. calculate) a set of calibration settings based on a target frequency curve and the threshold similar stored acoustic room response.

After applying the obtained calibration settings to itself, the playback device 210b outputs, via its one or more transducers, second audio content using the applied calibration settings. Even though the applied calibration settings were determined for a different playback device calibrated in a different room, the localized acoustic response of the room 201b is similar enough to the stored acoustic response that the second audio content is output in a manner that at least partially accounts for the acoustics of the room 201b. For instance, with the applied calibration settings, the second audio content output by the playback device 210b may have a frequency response, at one or more locations in the room 201b, that is closer to a target frequency response than the first audio content.

IV. Example Systems and Methods for Calibrating a Portable Playback Device

Figure 2D:
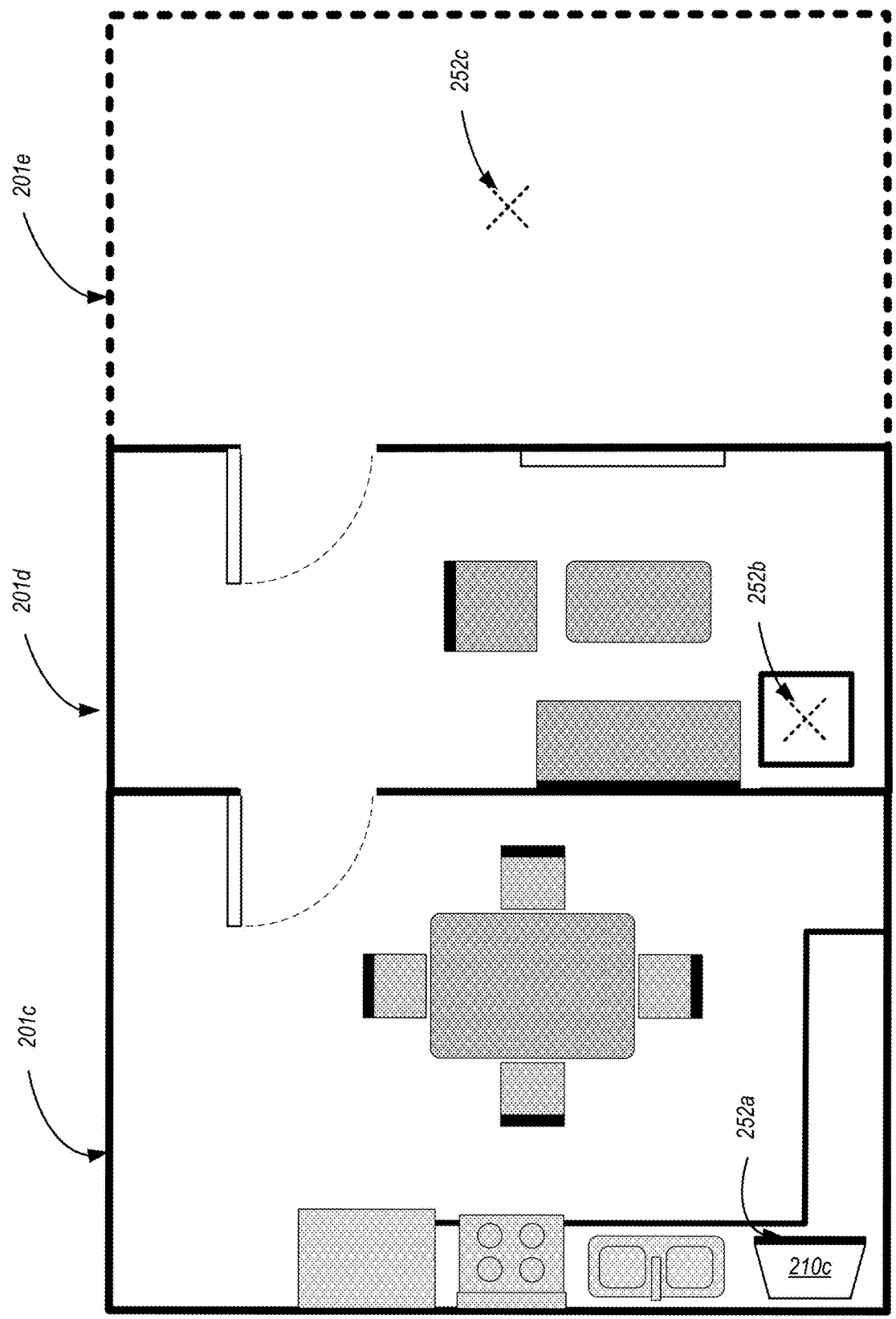
FIG. 2D is a diagram of playback environments within which a playback device may be calibrated.

FIG. 2D depicts example environments in which a portable playback device 210c performs playback device calibration upon changing conditions, such as movement to a new location or passage of time. The portable playback device 210c may be similar to any of the playback devices 110 depicted in FIGS. 1A-1E and 1G, and the network device 230 may be similar to any of the NMDs 120 or controllers 130 depicted in FIGS. 1A-1B and 1F-1H. In contrast with the playback devices 110, the portable playback device 210c may be configured for portable use. As such, the portable playback device 210c may include one or more batteries to power the portable playback device 210c while disconnected from wall power. Further, the components of the portable playback device 210c may be configured to facilitate portable use such as by implementing certain processors, amplifiers, and/or transducers to balance audio output levels and battery life. Yet further, a housing of the portable playback device 210c may be configured to facilitate portable use such as by including or incorporating a carrying handle or the like.

Figure 2E:
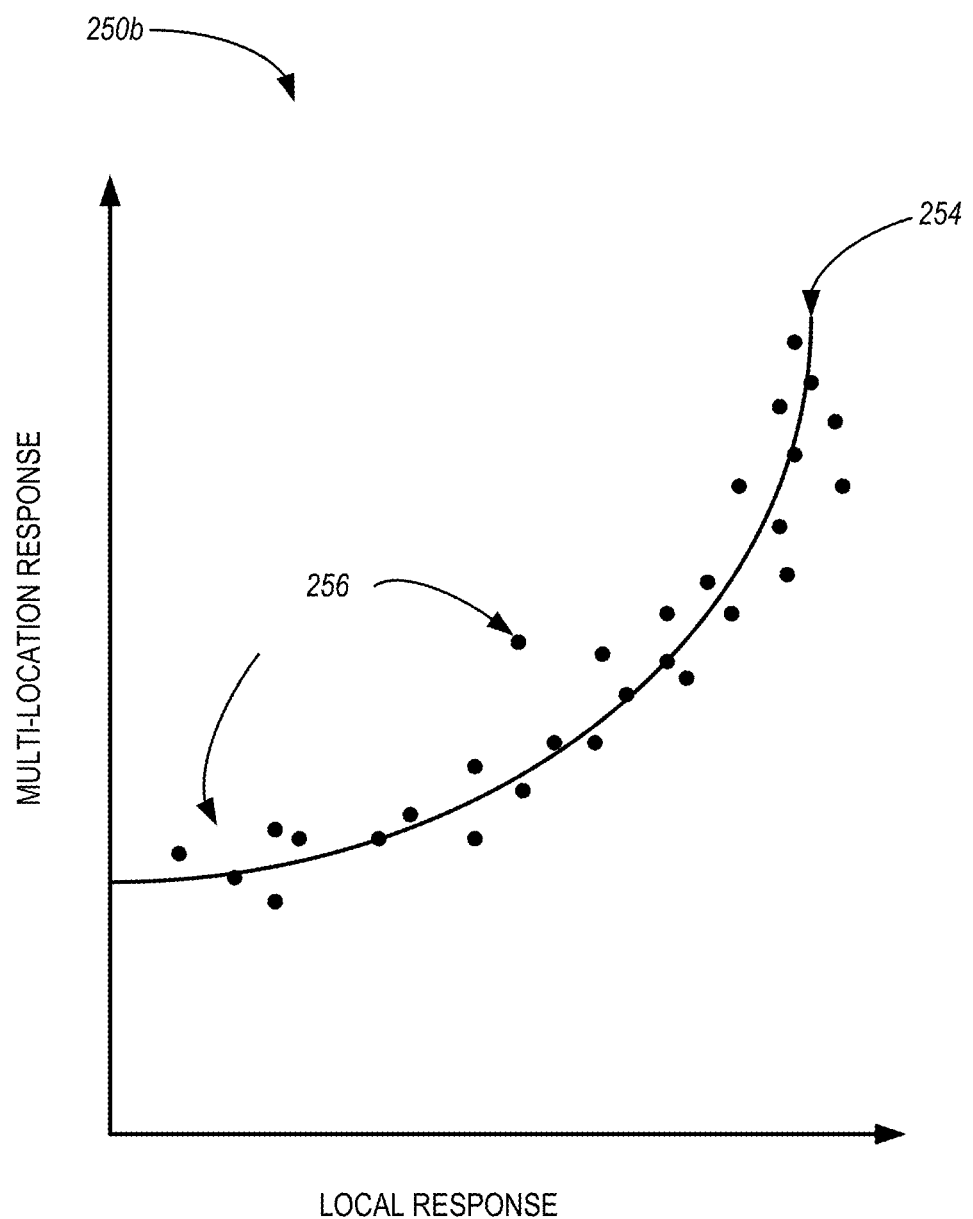
FIG. 2E is a graphical representation of a database for storing room response data and corresponding playback device calibration settings.

Given that the portable playback device 210c is configured for portable operation, during regular use, a user may be expected to relocate the portable playback device 210c relatively frequently. For example, at various times a user may move portable playback device 210c to locations 252a, 252b, and 252c in rooms 201c, 201d, and 201e, respectively. By way of example, room 201c may be a kitchen, room 201d may be a family room, and room 201e may be a patio or other outdoor area. Localized acoustic responses vary between rooms 201c, 201d, and 201e and self-calibration at each location is desirable. The portable playback device 210c might not consistently or reliably have access to database 250a and/or computing device 206, as the portable playback device 210c may be located out of Wi-Fi range or may disable its network interface(s) to lower battery use. As such, in some embodiments, the portable playback device 210c may include a locally stored database 250b (as shown in FIG. 2E) to perform self-calibration on the portable playback device 210c without accessing a remote database.

Additionally or alternatively, the playback device 210c may leverage both a remote database, such as database 250a, and a local database, such as database 250b, during various calibrations. More specifically, in some embodiments, the playback device 210c may access a remote database, such as database 250a, when said access is available. For example, the playback device 210c may perform calibration by accessing the remote database 250a when the playback device is within Wi-Fi range and by accessing the local database 250b when the playback device is outside of Wi-Fi range.

In some embodiments, portable playback devices may perform calibration using a multi-location acoustic response of a room by way of methods disclosed herein and incorporated by reference. In some embodiments, portable playback devices may leverage a database (e.g., 250a or 250b) used to perform self-calibration process without determining a multi-location acoustic response of its room by way of methods disclosed herein and incorporated by reference. Further, some portable playback devices may be configured to perform calibration by way of using a multi-location acoustic response of a room and self-calibration process without determining a multi-location acoustic response of its room. As such, a variety of calibration initiation techniques may be employed on portable playback devices to account for various device capabilities and environments.

A. Calibration Initiation

The portable playback device 210c calibration and/or self-calibration process may be initiated at various times and/or in various ways. In one example, calibration and/or self-calibration of the portable playback device 210c may be initiated when the portable playback device 210c is being set up for the first time, for example, in the room 201c and/or when the portable playback device 210c first outputs music or some other audio content, as described in any manner disclosed herein. In another example embodiment, the portable playback device 210c may initiate calibration and/or self-calibration when the power is turned on and/or audio content begins playing.

To account for the movement, and therefore changing conditions, of the portable playback device 210c, a variety of self-calibration initiation techniques may be employed. In some example embodiments, the playback device 210c initiates self-calibration based on movement to a new location. By way of example, a user may move the portable playback device 210c from room 201c to room 201d. The portable playback device 210c may initiate self-calibration once the portable playback device 210c is placed in the new location 252b. Similarly, the portable playback device 210c may stall or suspend any self-calibration upon indication of movement, as self-calibration while the portable playback device 210c is in transit is unnecessary and would result in an inaccurate acoustic room response.

In these examples, the portable playback device 210c may be configured to detect movement of the portable playback device 210c by way of, for example, one or more accelerometers, or other suitable motion detection devices (e.g., via a GPS or wireless signal strength variations). An accelerometer, or other motion detection device, is configured to collect and output data indicative of movement by the portable playback device 210c. The portable playback device 210c may determine whether to initiate self-calibration and/or suspend self-calibration based on movement data from the accelerometer. More specifically, the portable playback device 210c may suspend self-calibration upon receiving an indication from the accelerometer that the portable playback device 210c is in motion. Conversely, the portable playback device 210c may initiate self-calibration upon receiving an indication from the accelerometer that the portable playback device 210c is stationary for a predetermined duration of time (e.g., 5 seconds, 10 seconds). Further, the playback device 210c may not initiate calibration unless and/or until the playback device 210c is in use (i.e., outputting audio content).

In some example embodiments, self-calibration of the portable playback device 210c may only be initiated upon placement of the portable playback device 210c (i.e., self-calibration initiates when the portable playback device 210c is set down on a surface or playback device base (as described below)). In these examples, the portable playback device 210c does not initiate self-calibration until the portable playback device 210c has been moved and set down and is stationary.

In a different example scenario, a user may move the portable playback device 210c while in use (i.e., outputting audio content) but between self-calibration periods (i.e., the portable playback device 210c is not actively performing self-calibration). The portable playback device 210c may detect the motion by way of motion data from the accelerometer. In response to receiving the motion data, the portable playback device 210c may delay initiation of self-calibration until receiving data indicating the portable playback device 210c is stationary. Once the portable playback device 210c is stationary for a period of time (e.g., 2 seconds) the portable playback device 210c may initiate self-calibration and continue, for example, periodically thereafter.

Similarly, in another example scenario, a user may move the portable playback device 210c while in use and while the portable playback device 210c is performing self-calibration. In response to receiving data from the accelerometer indicating the portable playback device 210c is in motion, the portable playback device 210c may suspend calibration until the portable playback device 210c is stationary again. In some examples, the portable playback device 210c may initiate self-calibration once the portable playback device 210c is stationary for a period of time (e.g., 2 seconds). The portable playback device 210c may continue initiating self-calibration, for example, periodically thereafter. Similar methods may be utilized for other suitable motion detection devices, such as a GPS or gyroscope.

In some embodiments, while the portable playback device 210c is in motion, the most-recent determined audio calibration settings may be applied to the audio content. Alternatively, while the portable playback device 210c is in motion, standard audio calibration settings may be applied, such as a factory default setting. In another example, while the portable playback device 210c is in motion, the portable playback device 210c may apply stored set of audio calibration settings for use when the portable playback device 210c is in motion. Many other examples are possible. To avoid an abrupt change in audio calibration settings, such as when portable playback device 210c is picked up and factory default audio calibration settings are applied, audio calibration settings may be applied gradually (e.g., over a period of 5 seconds).

Further, in some embodiments, any calibration data stored on the portable playback device 210c or applied to the audio content may be erased from the portable playback device 210c once it is moved or picked up. By deleting calibration data, data storage and/or processing cycles may be freed up.

Additionally or alternatively, portable playback device 210c may be compatible with one or more playback device bases. A playback device base may include, for example, device charging systems, a base identifier (i.e., distinguishes that playback device base from other playback device bases), and a control system including one or more processors and a memory. Additional details regarding playback device bases may be found, for example, in U.S. Pat. No. 9,544,701, which was incorporated by reference above.

In some embodiments, a single playback device may be compatible with a number of playback device bases. Similarly, a playback device base may be compatible with a number of playback devices. By way of example, there may be a first, second, and third playback device base at locations 252a, 252b, and 252c, respectively. In this example, the portable playback device 210c may be compatible with all three playback device bases. In these examples, the portable playback device 210c may initiate calibration and/or self-calibration once the portable playback device 210c is placed on any of the playback device bases.

In some embodiments, the portable playback device 210c, the playback device base, and/or the computing device 206 may store the determined acoustic response once the portable playback device 210c has been calibrated at a particular base. For example, the portable playback device 210c may be placed on the playback device base at location 252b and initiate self-calibration. Once the self-calibration is complete, the portable playback device 210c, the playback device base, and/or the computing device 206 may store the determined audio calibration settings. More specifically, in some embodiments, the portable playback device 210c may store the determined acoustic response locally on the device with the corresponding playback device base identifier. This is desirable for future use, as the determined audio calibration settings can be readily be retrieved and applied to the portable playback device 210c once the portable playback device 210c is placed on the playback device base at a later time. Similarly, the determined audio calibration settings may be transmitted to a remote computing device, such as computing device 206, to be retrieved at a later time.

Further, the determined acoustic response may be stored locally on the playback device base or remotely on the computing device 206 for other playback devices placed on the playback device base at a later time. For example, a playback device, other than portable playback device 210c, may be compatible with and placed on the playback device base at location 252b. The newly placed playback device may retrieve and apply stored audio calibration settings for example, from the playback device base or the remote computing device 206.

Additionally, in some examples, a playback device base may be compatible with more than one type or model of playback device. In these examples, the playback device base and/or remote computing device 206 may store calibration settings specific to the different types of playback devices. For example, a playback device base may be compatible with portable playback device 210c and a "SONOS ONE" playback device. The playback device base and/or computing device 206 may store audio calibration settings corresponding to the type of playback device, such that audio calibrations settings specific to the type of device may be readily retrieved and applied to the audio content (e.g., "SONOS ONE" playback device calibration settings are applied to any "SONOS ONE" playback devices placed on the playback device base at a particular location). In another example embodiment, the playback device base and/or remote computing device 206 may store acoustic responses which are independent of device type. For example, the playback device 210c may retrieve and apply audio calibration settings corresponding to an acoustic response previously determined by a different type of playback device and stored on the playback device base and/or remote computing device 206.

In some example embodiments, the playback device base excludes a playback device base identifier. In these examples, the playback device 210c may perform calibration and/or self-calibration upon placement on the playback device base to identify the particular playback device base. For example, the playback device 210c may identify that it has been placed on a playback device base and match the same or similar acoustic response with a determined acoustic response from a previously performed calibration and/or self-calibration stored on the playback device 210c and retrieve and apply the audio calibration settings selected in the previous calibration.

Receiving the same or similar response indicates that the playback device 210c may be on the same playback device base as when the matching or similar acoustic response was previously recorded. In some examples the playback device 210c may store the acoustic responses and determined audio calibration setting in association with the particular playback device. In some examples, the matching or similar previously determined acoustic response may have been determined using the multi-location calibration techniques, whereas the more recent acoustic response was determined without using the multi-location calibration techniques. In these examples, the playback device 210c may apply the audio settings corresponding to the determined multi-location acoustic response, as this room response may be more accurate.

Alternatively, in examples where the playback device 210c does not identify a matching acoustic response, the playback device 210c may initiate or continue calibration and/or self-calibration according to any of the calibration initiation techniques described herein.

In another example, calibration and/or self-calibration of the portable playback device 210c may be initiated via a controller device, such as the controller device 130a depicted in FIG. 1H. For instance, a user may access a controller interface for the portable playback device 210c to initiate calibration of the playback device 210c. In one case, the user may access the controller interface, and select the portable playback device 210c (or a group of playback devices that includes the portable playback device 210c) for calibration. In some cases, a calibration interface may be provided as part of a playback device controller interface to allow a user to initiate playback device calibration. Additionally, self-calibration may be initiated based on a user input indicating that the portable playback device 210c has moved to a new location (e.g., a change in playback zone name associated with the playback device 210c). Other examples are also possible.

In another example, calibration of the portable playback device 210c may be initiated by a user via voice input or a voice command. In these examples, the portable playback device 210c may be an NMD, such as NMD 120a. The user may say a command, such as "calibrate" or "start calibration". Upon receipt and processing of the command, the portable playback device 210c may initiate calibration. Many other calibration initiation processing commands are possible.

Similarly, in some embodiments, the portable playback device 210c may initiate self-calibration in response to receiving an instruction or command to play audio content. For example, a user may issue a command by way of, for example, a controller device 130a or voice command to play music on the portable playback device 210c. Once the music begins playing, portable playback device 210c may initiate self-calibration.

In some examples, a user may wish to deactivate automatic or repetitive (e.g., periodic, as described below) self-calibration. In these examples, the user may deactivate or stall calibration by way of a controller device 130a or a voice command, as described above. For example, the user may toggle an automatic calibration function on or off by way of a user interface on the controller device 130a. This may be desirable to save battery power, as, in some implementations, the calibration is computationally intensive and involves significant battery usage. This may also be desirable to accommodate user preference. Self-calibration relies on enablement of one or more microphones on the portable playback device 210c, which may also be utilized for voice-commands, as described above. As such, the user may toggle off the automatic calibration of the portable playback device 210c due to a preference to keep the one or more microphones disabled.

Further, in some examples, self-calibration of the playback device 210b is initiated periodically, or after a threshold amount of time has elapsed after a previous calibration, in order to account for changes to the environment or changes in the location of the playback device 210c.

In some embodiments, the portable playback device 210c may initiate self-calibration periodically while the portable playback device 210c is in use (i.e., outputting audio content). For example, the time period between self-calibration cycles may be between 10 seconds and 30 seconds. In other examples, the portable playback device 210c may initiate self-calibration every 30 minutes. Many other examples are possible.

In some examples, the portable playback device 210c is playing audio content when the predetermined duration of time has passed. Because playing audio content is necessary for self-calibration, the portable playback device 210c may stall or suspend the calibration initiation until the portable playback device 210c begins outputting audio content (e.g., when a user issues a command to play music on the portable playback device 210c, as described above). Further, as described above, calibration may continue over a period of time until enough acoustic response data is recorded and collected. In some examples, the period between calibrations is measured from the time calibration is completed. In other examples, the period between calibrations is measured from the initiation of the calibration.

Receiving the same or similar acoustic response data indicates that the portable playback device 210c has not moved since a previous self-calibration and therefore does not require further calibration until the portable playback device 210c is relocated. As such, in some embodiments, periodic self-calibration initiation may slow (i.e., the time periods between self-calibration increase) or stop if the acoustic response data is the same or similar over a period of time.

For example, the portable playback device 210c may be in use (i.e., outputting audio content) in location 252a for an extended period without relocation. In this example, the portable playback device 210c may periodically initiate self-calibration every 20 seconds. After receiving the same or similar acoustic response a number of times (e.g., 15 times), the portable playback device may increase the self-calibration initiation period to, for example, 40 seconds. The portable playback device 210c may continue to increase the self-calibration initiation period upon repeatedly receiving the same or similar acoustic responses (e.g., 60 seconds, 80 seconds, etc.). In some embodiments, the portable playback device 210c may even suspend self-calibration initiation until receiving some other prompt to perform calibration and/or self-calibration (e.g., receiving data indicating motion of the portable playback device 210c, user instruction, etc.). This may be desirable to save battery power, as the self-calibration process is computationally intensive and involves a significant battery usage.

In some embodiments, periodic self-calibration initiation may be used in combination with other calibration and/or self-calibration initiation techniques, such as motion data based and/or playback device base calibration initiation. For example, the portable playback device 210c may periodically initiate self-calibration. In one example scenario, a user may move the portable playback device 210c while in use (i.e., outputting audio content) but between self-calibration periods. The portable playback device 210c may detect the motion by way of motion data from the accelerometer. In response to receiving the motion data, the portable playback device 210c may not initiate self-calibration until receiving data indicating the portable playback device 210c is stationary. Once the portable playback device 210c is stationary for a period of time (e.g., 10 seconds) the portable playback device 210c may initiate self-calibration and continue thereafter periodically.

Similarly, in another example scenario, a user may move the portable playback device 210c while in use and while the portable playback device is performing calibration and/or self-calibration. In response to receiving data from the accelerometer indicating the portable playback device 210c is in motion, the portable playback device may suspend self-calibration until the portable playback device is stationary again. Once the portable playback device 210c is stationary for a period of time (e.g., 10 seconds) the portable playback device 210c may initiate self-calibration and continue thereafter periodically. Additionally or alternatively, the playback device 210c may delete or discard the data collected via the microphone before the playback device 210c began moving (i.e., the data from the interrupted/suspended calibration).

Additionally or alternatively, in some embodiments the portable playback device 210c initiates self-calibration periodically while being used in conjunction with a playback device base to account for changing conditions in the environment of the portable playback device 210c. In an example scenario, a user may remove the portable playback device 210c from the playback device base at location 252a while in use but between self-calibration periods. Once the portable playback device 210c is removed from the playback device base, the portable playback device 210c does not initiate self-calibration until receiving data indicating the portable playback device 210c is stationary or placed on another playback device base (e.g., playback device base at location 252b). Once the portable playback device 210c is stationary for a period of time (e.g., 10 seconds) and/or is placed at another playback device base (e.g., playback device base at location 252b), the portable playback device 210c may initiate calibration and continue thereafter periodically.

Similarly, in an example scenario, a user may remove the portable playback device 210c from the playback device base at location 252a while outputting audio content and while the portable playback device 210c is performing calibration. Once the portable playback device 210c is removed from the playback device base, the portable playback device 210c, may suspend self-calibration until the portable playback device is stationary again or placed on another playback device base (e.g., playback device base at location 252b). Once the portable playback device 210c is stationary for a period of time and/or is placed at another playback device base (e.g., playback device base at location 252b), the portable playback device 210c may initiate self-calibration and continue thereafter periodically.

These calibration and self-calibration initiation techniques may be used alone or in combination with any calibration techniques described herein.

B. Portable Playback Device Local Calibration and Local Calibration Database

As described above, in some embodiments, portable playback devices may perform calibration using a multi-location acoustic response of a room by way of methods disclosed herein. In some embodiments, portable playback devices may leverage a database (e.g., 250a or 250b) to perform self-calibration process without determining a multi-location acoustic response of its room by way of methods disclosed herein. Further, some portable playback devices may be configured to perform both calibration by way of using a multi-location acoustic response of a room and self-calibration process without determining a multi-location acoustic response of its room. Due to movement and relocation, portable playback device 210c might not consistently or reliably have access to database 250a and/or computing device 206. As such, in some embodiments, the portable playback device 210c may include a locally stored database 250b (as shown in FIG. 2E) to perform self-calibration on the portable playback device 210c without accessing a remote database.

FIG. 2E depicts an example representation of database 250a to be locally stored database 250b for portable playback device 210c. To account for the storage and computational capabilities of an individual portable playback device 210c, the locally stored database 250b may be a representation or generalization of the database 250a stored on a remote computing device 206.

As described above, the database 250a leveraged during some self-calibration is based on historical calibration settings 256 previously collected on other playback devices in which a particular playback device was calibrated by determining calibration settings based on a multi-location acoustic response. In some examples, the database 250a includes historical calibration settings collected on many types of playback devices. In another example the database 250a includes historical calibration settings collected specifically on a number of portable playback devices. These historical calibration settings for portable playback devices may be developed through concurrent multi-location acoustic responses and localized acoustic responses, as described above.

In some example embodiments, the locally stored database 250b may include historical data points 256, or a representation thereof, from the entirety or a majority of database 250a. In other example embodiments, the locally stored database 250b may include historical data points 256, or a representation thereof, from calibration settings collected on portable playback devices. Alternatively, in some example embodiments, the locally stored database 250b may include historical data points 256, or a representation thereof, from calibration settings collected on a limited number of types of playback devices which are similar in some way to portable playback devices. Many examples are possible.

In some example embodiments, the locally stored database 250b is a generalization of database 250a. One example of such a generalization or representation is a best fit line 254 of a frequency response. In these examples, the portable playback device 210c may locally store the generalization (i.e., best fit line 254) data. Another example of a generalization or representation is a best fit line 254 of historical local responses corresponding to historical multi-location responses. While FIG. 2E illustrates a best fit line 254 along two axes, a best fit line 254 may be representative of a number of inputs in multi-dimensional space. This is desirable as a best fit line 254 requires much less memory and self-calibration may be much less computationally intensive. In these examples, the locally stored database 250b may only include the best fit line(s) 254 rather than the individual historical data points 256. While FIG. 2E illustrates a single best fit line 254, locally stored database 250b may include a number of best fit lines 254. Other examples of representations and generalizations are possible as well. Further, the portable playback device 210c software updates may include updating database 250b to include updated data, as more multi-location calibration settings and localized acoustic responses are added to database 250a, as described above.

Self-calibration of portable playback devices may be similar to the methods of self-calibration of stationary playbacks described, herein. During self-calibration of a portable playback device 210c, however, the portable playback device may leverage the locally stored database 250b, rather than database 250a.

For example, when performing the self-calibration process, the portable playback device 210c outputs audio content and determines a localized acoustic response of its room 201c similarly to how playback devices 210a and 210b determined a localized acoustic response of rooms 201a and 201b, respectively. For instance, the portable playback device 210c outputs audio content, which may include music or one or more predefined tones, captures audio data representing reflections of the audio content within the room 201c, and determines the localized acoustic response based on the captured audio data.

As described above, in examples where the portable playback device 210c outputs music, the portable playback device 210c may continue to capture audio data representing reflections of the output music within the room 201c until a threshold amount of data at a threshold amount of frequencies is captured. Depending on the spectral content of the output music, the portable playback device 210c may capture the reflected audio data over the course of multiple songs, for instance, in order for the portable playback device 210c to have captured the threshold amount of data at the threshold amount of frequencies. In this manner, the portable playback device 210c learns the localized acoustic response of the room 201c, and once a threshold confidence in understanding of the localized acoustic response of the room 201c is met, then the playback device 210c uses the localized acoustic response of the room 201c to determine calibration settings for the portable playback device 210c utilizing the locally stored database 250b, as described in further detail below.

While outputting the audio content, the portable playback device 210c uses one or more stationary microphones, which may be disposed in or on a housing of the portable playback device 210c or may be co-located in or on an NMD proximate to the portable playback device 210c, to capture audio data representing reflections of the audio content in the room 201c. The playback device 210c then uses the captured audio data to determine the localized acoustic response of the room 201c. As described above, the localized acoustic response may include a spectral response, spatial response, or temporal response, among others, and the localized acoustic response may be represented in vector or matrix form.

In some embodiments, determining the localized acoustic response of the room 201c involves accounting for a self-response of the portable playback device 210c or of a microphone of the portable playback device 210c, for example, by processing the captured audio data representing reflections of the audio content in the room 201c so that the captured audio data reduces or excludes the playback device's native influence on the audio reflections.

In one example, the self-response of the portable playback device 210c is determined in an anechoic chamber, or is otherwise known based on a self-response of a similar portable playback device being determined in an anechoic chamber. In the anechoic chamber, audio content output by the portable playback device 210c is inhibited from reflecting back toward the portable playback device 210c, so that audio captured by a microphone of the portable playback device 210c is indicative of the self-response of the portable playback device 210c or of the microphone of the portable playback device 210c. Knowing the self-response of the portable playback device 210c or of the microphone of the portable playback device 210c, the portable playback device 210c offsets such a self-response from the captured audio data representing reflections of the first audio content when determining the localized acoustic response of the room 201c.

Further, in some example scenarios, the portable playback device 210c may be in a very noisy environment, such as a social event or outdoors. As such, in some examples, the audio processing algorithm may include a noise classifier to filter out noise when performing calibration or self-calibration. The noise classifier may be applied by the playback device 210c (e.g., via audio processing components 112g). Additionally or alternatively, the portable playback device 210c may apply a beam forming algorithm, such as a multichannel Weiner filter, to eliminate certain environmental noises (e.g., conversations in the foreground) when calibrating and/or self-calibrating the portable playback device 210c.

Once the localized acoustic response of the room 201c is known, the portable playback device 210c accesses the locally stored database 250b to determine a set of calibration settings to account for the acoustic response of the room 201c. For example, the portable playback device 210c queries the locally stored database 250b for a stored best fit line 254 room response that corresponds to the determined localized acoustic response of the room 201c.

In some examples, querying the locally stored database 250b involves mapping the determined localized acoustic response of the room 201c to a particular stored acoustic room response in the database locally stored database 250b that satisfies a threshold similarity to the localized acoustic response of the room 201c. More specifically, in some example embodiments, the playback device 210c determines a recorded and stored localized acoustic response from a previous multi-location calibration which is within a threshold similarity (e.g., most similar to) the localized acoustic response of the room 201b. This mapping may involve comparing values of the localized acoustic response to values of the stored acoustic room responses, or representations thereof according to the best fit line(s) 254, and determining which of the stored acoustic room responses are similar to the localized acoustic response. In some embodiments, the most similar stored acoustic room response is selected. Other examples are possible as well.

Once a stored acoustic room response of the locally stored database 250b is selected to be threshold similar to the localized acoustic response of the room 201c, then the portable playback device 210c identifies a set of calibration settings associated with the threshold similar stored acoustic room response. For instance, as shown in FIG. 2E, the best fit line 254 associates room responses and audio calibration settings. As such, the portable playback device 210c retrieves, or otherwise obtains from the locally stored database 250b, the set of calibration settings associated with the similar stored acoustic room response and applies the set of calibration settings to itself.

Portable playback device 210c may repeat this self-calibration process, or any other calibration process described herein, in any room or area (e.g., 201d and/or 20e) it is moved to according to any of the calibration initiation techniques described herein.

V. Example Methods

Figure 3:
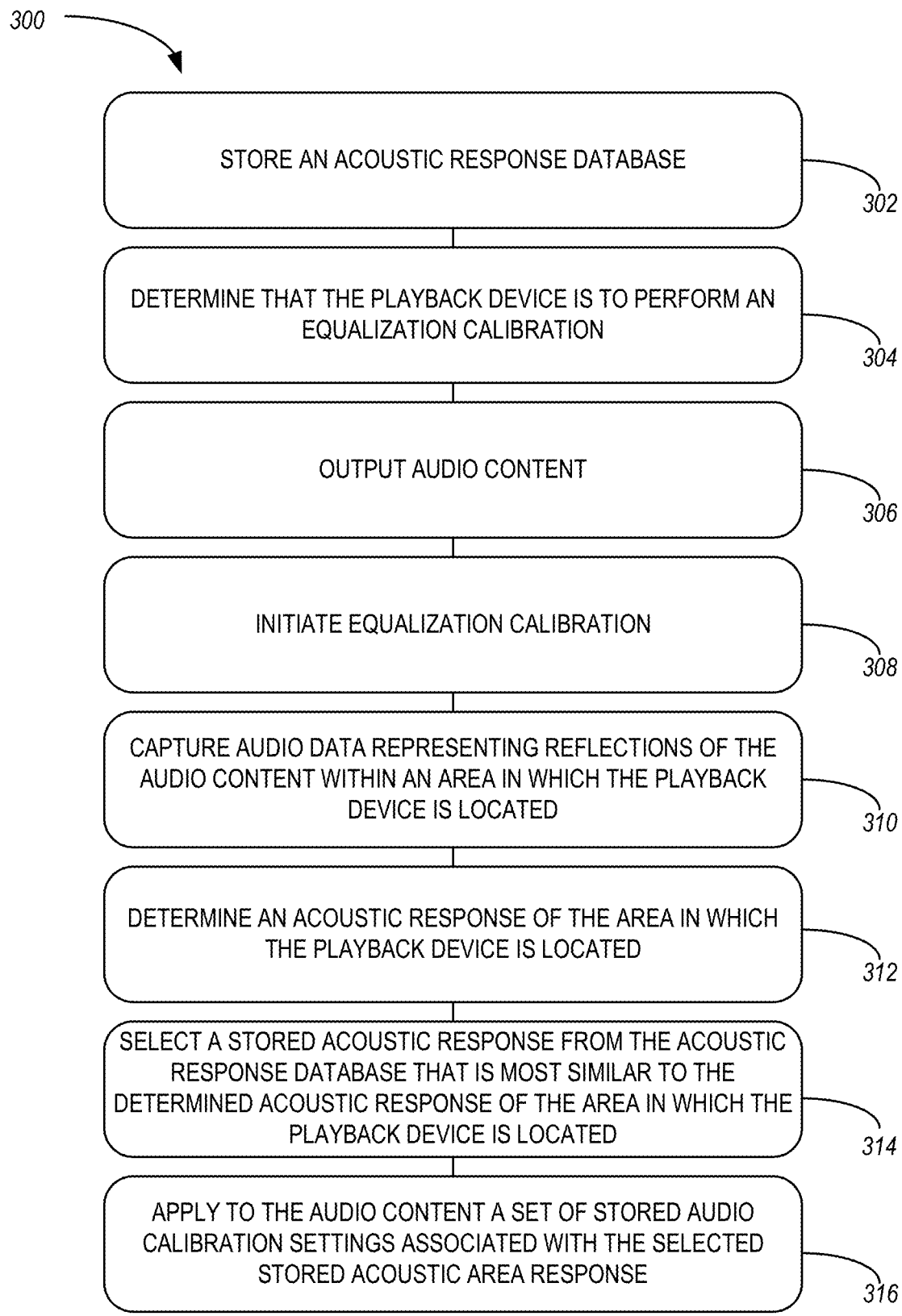
FIG. 3 is a flowchart of a method to calibrate a portable playback device.

FIG. 3 shows an example embodiment of a method 300 for establishing a database of calibration settings for playback devices. Method 300 can be implemented by any of the playback devices disclosed and/or described herein, or any other playback device now known or later developed.

Various embodiments of method 300 include one or more operations, functions, and actions illustrated by blocks 302 through 316. Although the blocks are illustrated in sequential order, these blocks may also be performed in parallel, and/or in a different order than the order disclosed and described herein. Also, the various blocks may be combined into fewer blocks, divided into additional blocks, and/or removed based upon a desired implementation.

In addition, for the method 300 and for other processes and methods disclosed herein, the flowcharts show functionality and operation of one possible implementation of some embodiments. In this regard, each block may represent a module, a segment, or a portion of program code, which includes one or more instructions executable by one or more processors for implementing specific logical functions or steps in the process. The program code may be stored on any type of computer readable medium, for example, such as a storage device including a disk or hard drive. The computer readable medium may include non-transitory computer readable media, for example, such as tangible, non-transitory computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the methods 300 and 320 and for other processes and methods disclosed herein, each block in FIG. 3 may represent circuitry that is wired to perform the specific logical functions in the process.

Method 300 involves calibrating a portable playback device by way of a locally stored acoustic response database.

Method 300 begins at a block 302, which involves storing, via a playback device, an acoustic response database comprising a plurality of sets of stored audio calibration settings. Each set of stored audio calibration settings is associated with a respective stored acoustic area response of a plurality of stored acoustic area responses. Example acoustic response databases include the database 250a (FIG. 2B) and the database 250b (FIG. 2E).

At the block 304, the method 300 involves determining that the playback device is to perform an equalization calibration of the playback device. In some embodiments, the block 304 may further involve, receiving from the accelerometer, data indicating the playback device is stationary for a predetermined duration of time. In response to detecting that the playback device is stationary for the predetermined duration of time, the playback device initiates the equalization calibration of the playback device.

In some embodiments, the block 304 may additionally involve performing the equalization calibration periodically over a first time period. Further, the playback device may receive, from the accelerometer, data indicating the playback device is stationary for a predetermined duration of time. In response to detecting that the playback device is stationary over the predetermined duration of time, the playback device performs the equalization calibration periodically over a second time period. The second time period is longer than the first time period.

In some embodiments, the block 304 may additionally involve receiving an instruction to play audio content. In response to the instruction to play audio content, the playback device plays the audio content and initiates the equalization calibration of the playback device.

In some embodiments, the block 304 may additionally involve excluding captured audio data representing noise in the area in which the playback device is located.

At block 306, method 300 involves outputting, via the speaker, audio content.

At block 308, the method 300 involves initiating the equalization calibration. In some embodiments, block 308 may additionally involve performing the equalization calibration periodically, wherein a time period between the equalization calibration is between 10 seconds and 30 seconds.

At block 310, method 300 involves capturing, via the microphone, audio data representing reflections of the audio content within an area in which the playback device is located.

At block 312, method 300 involves determining, via the playback device, an acoustic response of the area in which the playback device is located based on at least the captured audio data.

At block 314, method 300 involves selecting, via the playback device, a stored acoustic response from the acoustic response database that is most similar to the determined acoustic response of the area in which the playback device is located.

At block 316, method 300 involves applying to the audio content, via the playback device, a set of stored audio calibration settings associated with the selected stored acoustic area response.

In some embodiments, method 300 further involves receiving, from the accelerometer, data indicating motion of the playback device. In response to receiving data indicating motion of the playback device, the playback device suspends the equalization calibration of the playback device.

VI. Additional Examples

Figure 4A:
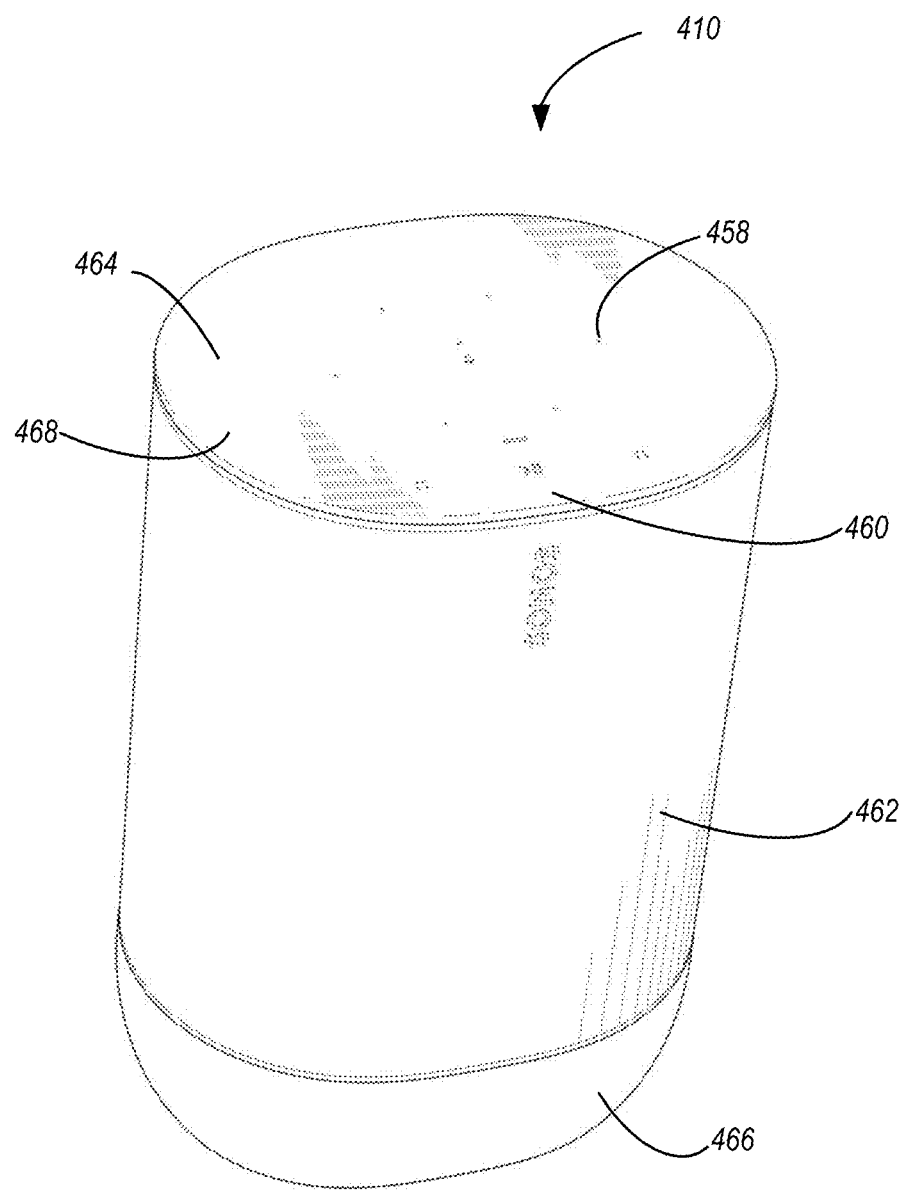
FIG. 4A is a first isometric view of a first example portable playback device.

FIG. 4A is a first isometric view of an example portable playback device 410. As shown in FIG. 4A, the portable playback device 410 includes a housing 464 comprising an upper portion 468, a lower portion 466 and an intermediate portion 462 (e.g., a grille). The grille of the intermediate portion 462 allows sound to pass through from the one or more transducers positioned within the housing 464.

A plurality of ports, holes or apertures 458 in the upper portion 468 allow sound to pass through to one or more microphones positioned within the housing 464. These microphones may be utilized in the example calibration techniques disclosed herein.

The upper portion 468 further includes a user interface 460. The user interface 460 includes a plurality of control surfaces (e.g., buttons, knobs, capacitive surfaces) including playback and activation controls (e.g., a previous control, a next control, a play and/or pause control). The user interface 460 is configured to receive touch input corresponding to activation and deactivation of the one or microphones.

Figure 4B:
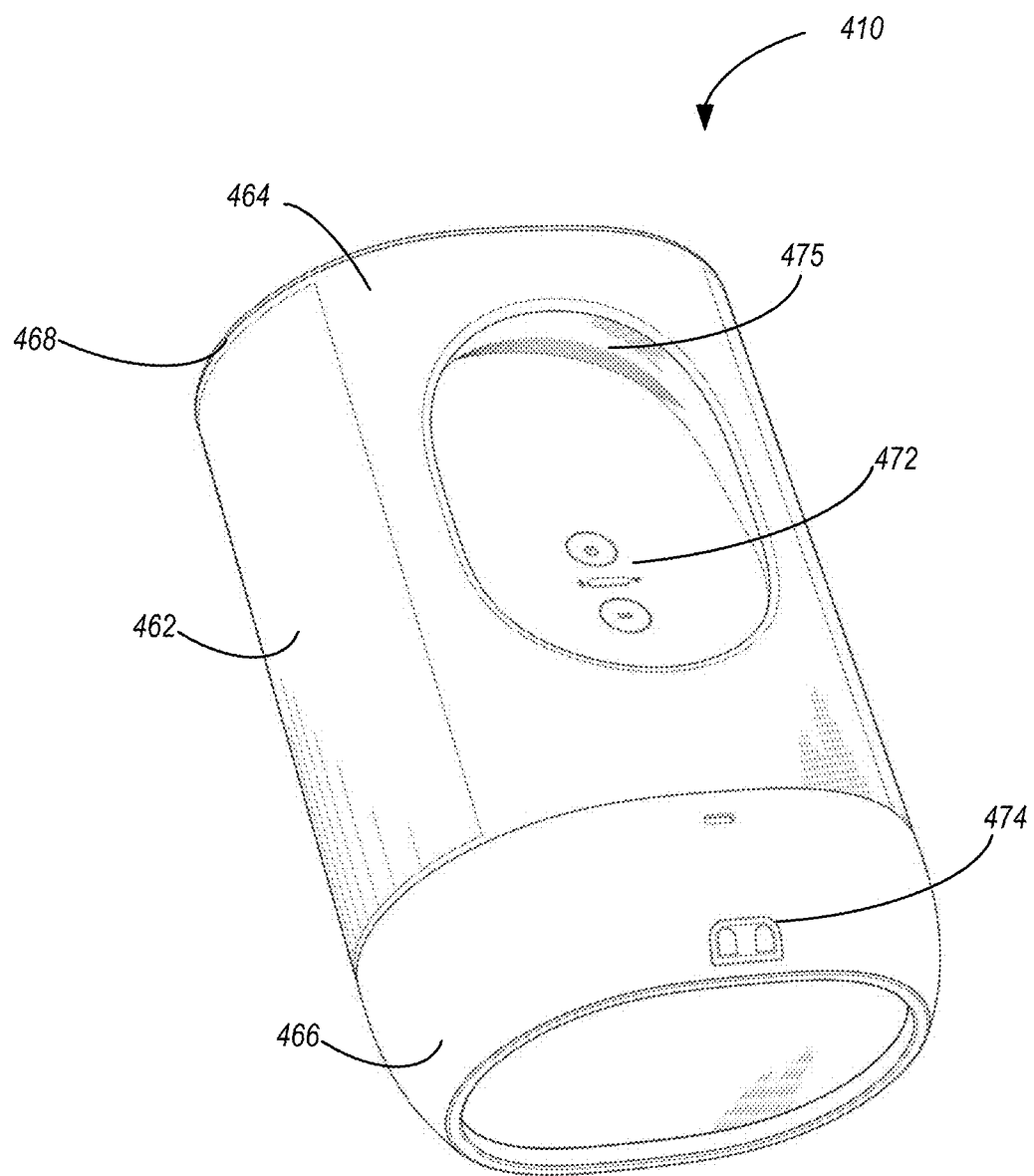
FIG. 4B is a second isometric view of the first example portable playback device.

FIG. 4B is a second isometric view of the portable playback device 410. As shown in FIG. 4B, the intermediate portion 462 further includes a user interface 472. The user interface 472 includes a plurality of control surfaces (e.g., buttons, knobs, capacitive surfaces) including playback, activation controls (e.g., a power toggle button, a Bluetooth device discovery control, etc.), and a carrying handle 475. The lower portion 466 also includes a power receptacle 474, as shown.

Figure 5:
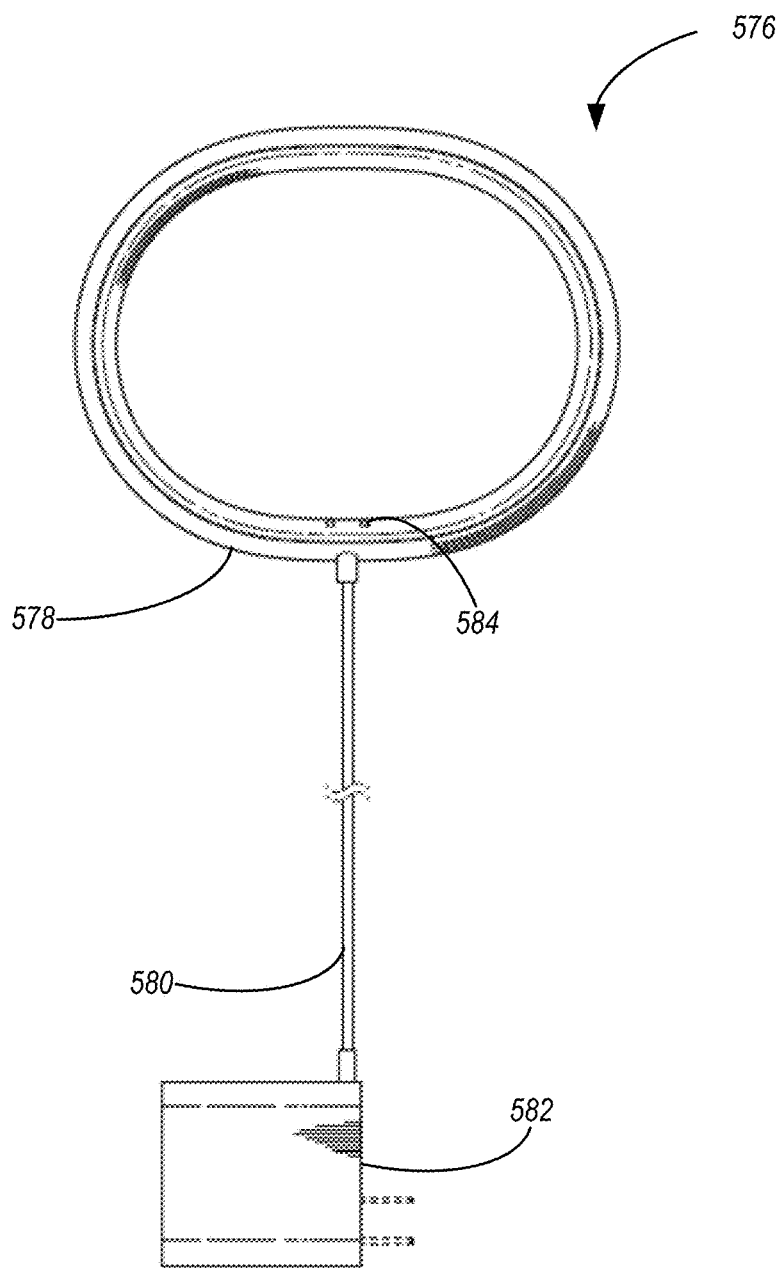
FIG. 5 is a top view of a playback device base to be used in conjunction with a portable playback device, such as the example portable playback device.

FIG. 5 is a top view of a playback device base 576 to be used in conjunction with a portable playback device, such as playback device 410. As shown in FIG. 5, the playback device base 576 includes a device receptacle 578, a power cord 580, and a power plug 582.

The device receptacle 578 is configured to receive playback device 410. The device receptacle 578 further includes a connection port 584 compatible with the playback device 410. As shown in FIG. 5, in some embodiments, the receptacle 578 may be a loop. Many other examples are possible.

In some embodiments, the power cord 580 is compatible with an electrical outlet. In other embodiments, the power cord 580 may be compatible with a USB port. In another embodiment, the power cord 580 may be compatible with both an electrical outlet and a USB port by way of detachable pieces, for example.

As described above, when on the playback device base 576, the portable playback device 410 may initiate calibration. When removed from the playback device base 576, the portable playback device 410 may suspend calibration until the portable device 410 is stationary again. Further, when on the playback device base 576, the portable playback device base 576 may provide power (i.e., battery recharging) to portable playback device 410.

VII. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The present technology is illustrated, for example, according to various aspects described below. Various examples of aspects of the present technology are described as numbered examples (1, 2, 3, etc.) for convenience. These are provided as examples and do not limit the present technology. It is noted that any of the dependent examples may be combined in any combination, and placed into a respective independent example. The other examples can be presented in a similar manner.

Example 1

A method comprising: storing an acoustic response database comprising a plurality of sets of stored audio calibration settings, each set of stored audio calibration settings associated with a respective stored acoustic area response of a plurality of stored acoustic area responses; determining that the playback device is to perform an equalization calibration of the playback device; and in response to the determination that the playback device is to perform the equalization calibration, initiating the equalization calibration, wherein the equalization calibration comprises: outputting, via the speaker, audio content; capturing, via the microphone, audio data representing reflections of the audio content within an area in which the playback device is located; based on at least the captured audio data, determining an acoustic response of the area in which the playback device is located; selecting a stored acoustic response from the acoustic response database that is most similar to the determined acoustic response of the area in which the playback device is located; and applying to the audio content, a set of stored audio calibration settings associated with the selected stored acoustic response.

Example 2

The method of example 1, further comprising receiving, from the accelerometer, data indicating motion of the playback device; and in response to receiving data indicating motion of the playback device, suspending the equalization calibration of the playback device.

Example 3

The method of any of examples 1-2, wherein determining that the playback device is to perform the equalization calibration of the playback device further comprises: receiving, from the accelerometer, data indicating the playback device is stationary for a predetermined duration of time; and in response to detecting that the playback device is stationary for the predetermined duration of time, initiating the equalization calibration of the playback device.

Example 4

The method of any of examples 1-3, wherein determining that the playback device is to perform the equalization calibration of the playback device comprises: performing the equalization calibration periodically over a first time period; receiving, from the accelerometer, data indicating the playback device is stationary for a predetermined duration of time; and in response to detecting that the playback device is stationary over the predetermined duration of time, performing the equalization calibration periodically over a second time period, wherein the second time period is longer than the first time period.

Example 5

The method of any of examples 1-4, wherein initiating the equalization calibration comprises performing the equalization calibration periodically, wherein a time period between the equalization calibration is between 10 seconds and 30 seconds.

Example 6

The method of any of examples 1-5, wherein determining that the playback device is to perform the equalization calibration of the playback device further comprises: receiving an instruction to play audio content; and in response to the instruction to play audio content, playing the audio content and initiating the equalization calibration of the playback device Example 7

The method of any of examples 1-6, wherein initiating the equalization calibration comprises performing the equalization calibration periodically according to a time period between the equalization calibrations, and wherein determining that the playback device is to perform the equalization calibration of the playback device further comprises:

determining the playback device is not outputting audio content when the time period between equalization calibration has elapsed; and in response determining the playback device is not outputting audio content, suspending the equalization calibration of the playback device.

Example 8

The method of any of examples 1-7, wherein determining the acoustic response of the area in which the playback device is located further comprises: excluding captured audio data representing noise in the area in which the playback device is located.

Example 9

The method of any examples 1-8, wherein the plurality of stored acoustic area responses corresponds to a plurality of best fit lines of acoustic responses previously measured on multiple media playback systems.

Example 10

The method of any of examples 1-9, wherein each respective set of stored audio calibration settings includes respective audio calibration settings for offsetting one or more audio characteristics of an associated respective stored acoustic area response.

Example 11

A playback device configured to perform the method of any of examples 1-10.

Example 12

A tangible, non-transitory computer-readable medium having stored therein instructions executable by one or more processors to cause a device to perform the method of any of features 1-10.

Example 13

A system configured to perform the method of any of features 1-10.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

What is claimed is:

1. A playback device comprising:
   a microphone;
   a speaker;
   one or more processors;
   an accelerometer configured to output data indicative of movement by the playback device; and
   data storage storing instructions executable by the one or more processors to cause the playback device to perform operations comprising:
   storing an acoustic response database comprising a plurality of sets of stored audio calibration settings, each set of stored audio calibration settings associated with a respective stored acoustic area response of a plurality of stored acoustic area responses;
   determining that the playback device is to perform an equalization calibration of the playback device; and
   in response to the determination that the playback device is to perform the equalization calibration, initiating the equalization calibration, wherein the equalization calibration comprises:
   outputting, via the speaker, audio content;
   capturing, via the microphone, audio data representing reflections of the audio content within an area in which the playback device is located;
   based on at least the captured audio data, determining an acoustic response of the area in which the playback device is located;
   selecting a stored acoustic response from the acoustic response database that is most similar to the determined acoustic response of the area in which the playback device is located; and
   applying to the audio content, a set of stored audio calibration settings associated with the selected stored acoustic response.

2. The playback device of claim 1, wherein the operations further comprise:
   receiving, from the accelerometer, data indicating motion of the playback device; and
   in response to receiving data indicating motion of the playback device, suspending the equalization calibration of the playback device.

3. The playback device of claim 1, wherein determining that the playback device is to perform the equalization calibration of the playback device further comprises:
   receiving, from the accelerometer, data indicating the playback device is stationary for a predetermined duration of time; and
   in response to detecting that the playback device is stationary for the predetermined duration of time, initiating the equalization calibration of the playback device.

4. The playback device of claim 1 wherein determining that the playback device is to perform the equalization calibration of the playback device comprises:
   performing the equalization calibration periodically over a first time period;
   receiving, from the accelerometer, data indicating the playback device is stationary for a predetermined duration of time; and
   in response to detecting that the playback device is stationary over the predetermined duration of time, performing the equalization calibration periodically over a second time period, wherein the second time period is longer than the first time period.

5. The playback device of claim 1 wherein initiating the equalization calibration comprises performing the equalization calibration periodically, wherein a time period between the equalization calibration is between 10 seconds and 30 seconds.

6. The playback device of claim 1, wherein determining that the playback device is to perform the equalization calibration of the playback device further comprises:
receiving an instruction to play audio content; and
in response to the instruction to play audio content, playing the audio content and initiating the equalization calibration of the playback device.

7. The playback device of claim 1, wherein initiating the equalization calibration comprises performing the equalization calibration periodically according to a time period between the equalization calibrations, and wherein determining that the playback device is to perform the equalization calibration of the playback device further comprises:
determining the playback device is not outputting audio content when the time period between equalization calibration has elapsed; and
in response determining the playback device is not outputting audio content, suspending the equalization calibration of the playback device.

8. The playback device of claim 1, wherein determining the acoustic response of the area in which the playback device is located further comprises:
excluding captured audio data representing noise in the area in which the playback device is located.

9. The playback device of claim 1, wherein the plurality of stored acoustic area responses corresponds to a plurality of best fit lines of acoustic responses previously measured on multiple media playback systems.

10. The playback device of claim 1, wherein each respective set of stored audio calibration settings includes respective audio calibration settings for offsetting one or more audio characteristics of an associated respective stored acoustic area response.

11. A method comprising:
storing, via a playback device, an acoustic response database comprising a plurality of sets of stored audio calibration settings, each set of stored audio calibration settings associated with a respective stored acoustic area response of a plurality of stored acoustic area responses, wherein the playback device comprises a speaker, a microphone, and an accelerometer;
determining that the playback device is to perform an equalization calibration of the playback device; and
in response to the determination that the playback device is to perform the equalization calibration, initiating the equalization calibration, wherein the equalization calibration comprises:
outputting, via the speaker, audio content;
capturing, via the microphone, audio data representing reflections of the audio content within an area in which the playback device is located;
based on at least the captured audio data, determining, via the playback device, an acoustic response of the area in which the playback device is located;
selecting, via the playback device, a stored acoustic response from the acoustic response database that is most similar to the determined acoustic response of the area in which the playback device is located; and
applying to the audio content, via the playback device, a set of stored audio calibration settings associated with the selected stored acoustic area response.

12. The method of claim 11, further comprising:
receiving, from the accelerometer, data indicating motion of the playback device; and
in response to receiving data indicating motion of the playback device, suspending the equalization calibration of the playback device.

13. The method of claim 11, wherein determining that the playback device is to perform the equalization calibration of the playback device further comprises:
receiving, from the accelerometer, data indicating the playback device is stationary for a predetermined duration of time; and
in response to detecting that the playback device is stationary for the predetermined duration of time, initiating the equalization calibration of the playback device.

14. The method of claim 11, wherein determining that the playback device is to perform the equalization calibration of the playback device comprises:
performing the equalization calibration periodically over a first time period;
receiving, from the accelerometer, data indicating the playback device is stationary for a predetermined duration of time; and
in response to detecting that the playback device is stationary over the predetermined duration of time, performing the equalization calibration periodically over a second time period, wherein the second time period is longer than the first time period.

15. The method of claim 11, wherein initiating the equalization calibration comprises performing the equalization calibration periodically, wherein a time period between the equalization calibration is between 10 seconds and 30 seconds.

16. The method of claim 11, wherein determining that the playback device is to perform the equalization calibration of the playback device further comprises:
receiving an instruction to play audio content; and
in response to the instruction to play audio content, playing the audio content and initiating the equalization calibration of the playback device.

17. The method of claim 11, wherein determining the acoustic response of the area in which the playback device is located further comprises:
excluding captured audio data representing noise in the area in which the playback device is located.

18. The method of claim 11, wherein the plurality of stored acoustic area responses corresponds to a plurality of best fit lines of acoustic responses previously measured on multiple media playback systems.

19. The method of claim 11, wherein each respective set of stored audio calibration settings includes respective audio calibration settings for offsetting one or more audio characteristics of an associated respective stored acoustic area response.

20. Tangible, non-transitory computer-readable media comprising instructions that, when executed, cause a mobile device to perform a method comprising:
storing, via a playback device, an acoustic response database comprising a plurality of sets of stored audio calibration settings, each set of stored audio calibration settings associated with a respective stored acoustic area response of a plurality of stored acoustic area responses, wherein the playback device comprises a speaker, a microphone, and an accelerometer;
determining that the playback device is to perform an equalization calibration of the playback device; and in response to the determination that the playback device is to perform the equalization calibration, initiating the equalization calibration, wherein the equalization calibration comprises:
  outputting, via the speaker, audio content;
  capturing, via the microphone, audio data representing reflections of the audio content within an area in which the playback device is located;
  based on at least the captured audio data, determining, via the playback device, an acoustic response of the area in which the playback device is located;
  selecting, via the playback device, a stored acoustic response from the acoustic response database that is most similar to the determined acoustic response of the area in which the playback device is located; and
  applying to the audio content, via the playback device, a set of stored audio calibration settings associated with the selected stored acoustic area response.

* * * * *